(12) United States Patent
Wu et al.

(10) Patent No.: US 12,527,071 B2
(45) Date of Patent: Jan. 13, 2026

(54) METAL GATE STRUCTURE CUTTING PROCESS

(71) Applicant: Taiwan Semiconductor Manufacturing Co., Ltd., Hsin-Chu (TW)

(72) Inventors: I-Wen Wu, Hsinchu (TW); Chen-Ming Lee, Taoyuan County (TW); Fu-Kai Yang, Hsinchu (TW); Mei-Yun Wang, Hsin-Chu (TW); Chang-Yun Chang, Taipei (TW); Ching-Feng Fu, Taichung (TW); Peng Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 388 days.

(21) Appl. No.: 18/345,188

(22) Filed: Jun. 30, 2023

(65) Prior Publication Data

US 2023/0352345 A1 Nov. 2, 2023

Related U.S. Application Data

(60) Division of application No. 17/181,217, filed on Feb. 22, 2021, now Pat. No. 11,694,931, which is a
(Continued)

(51) Int. Cl.
*H10D 84/03* (2025.01)
*H01L 21/768* (2006.01)
(Continued)

(52) U.S. Cl.
CPC ..... *H10D 84/038* (2025.01); *H01L 21/76802* (2013.01); *H01L 21/76877* (2013.01);
(Continued)

(58) Field of Classification Search
CPC .... H10D 84/038; H10D 30/024; H10D 30/62; H10D 30/6219; H10D 62/113;
(Continued)

(56) References Cited

U.S. PATENT DOCUMENTS 8,772,109 B2 7/2014 Colinge
8,785,285 B2 7/2014 Tsai et al.
(Continued)

FOREIGN PATENT DOCUMENTS

CN 107039348 A 8/2017
KR 20180079160 A 7/2018
TW 201731023 A 9/2017

*Primary Examiner* — Earl N Taylor
(74) *Attorney, Agent, or Firm* — HAYNES AND BOONE, LLP

(57) ABSTRACT

A method includes forming a fin protruding from a substrate, forming a gate structure across the fin, forming an epitaxial feature over the fin, depositing a dielectric layer covering the epitaxial feature and over sidewalls of the gate structure, performing an etching process to form a trench, the trench dividing the gate structure into first and second gate segments and extending into a region of the dielectric layer, forming a dielectric feature in the trench, recessing a portion of the dielectric feature located in the region, selectively etching the dielectric layer to expose the epitaxial feature, and depositing a conductive feature in physical contact with the epitaxial feature and directly above the portion of the dielectric feature.

20 Claims, 31 Drawing Sheets

Related U.S. Application Data continuation of application No. 16/536,913, filed on Aug. 9, 2019, now Pat. No. 10,930,564.

(60) Provisional application No. 62/725,818, filed on Aug. 31, 2018.

(51) Int. Cl.
*H01L 23/485* (2006.01)
*H01L 23/522* (2006.01)
*H10D 30/01* (2025.01)
*H10D 30/62* (2025.01)
*H10D 62/10* (2025.01)
*H10D 84/01* (2025.01)
*H10D 84/83* (2025.01)

(52) U.S. Cl.
CPC ...... *H01L 21/76897* (2013.01); *H01L 23/485* (2013.01); *H01L 23/5226* (2013.01); *H10D 30/024* (2025.01); *H10D 30/62* (2025.01); *H10D 30/6219* (2025.01); *H10D 62/113* (2025.01); *H10D 62/115* (2025.01); *H10D 84/0149* (2025.01); *H10D 84/0153* (2025.01); *H10D 84/0158* (2025.01); *H10D 84/834* (2025.01)

(58) Field of Classification Search
CPC ............ H10D 62/115; H10D 84/0149; H10D 84/0158; H10D 84/834; H10D 84/0151; H10D 30/6211; H10D 64/017; H10D 30/0212; H10D 84/013; H10D 30/611; H10D 30/6215; H10D 62/021; H10D 64/027; H01L 21/76802; H01L 21/76877; H01L 21/76897; H01L 23/485; H01L 23/5226; H01L 21/76801; H01L 21/31105; H01L 29/785; H01L 29/78; H01L 29/7855; H01L 29/7851; H01L 29/66795; H01L 29/66545; H01L 29/66636; H01L 29/66621; H01L 29/665; H01L 27/0886; H01L 21/823481; H01L 21/823475; H01L 21/823418; H01L 21/823431; H01L 29/0642; H01L 29/0649; H01L 29/41791
See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 9,911,736 | B1 | 3/2018 | Zang et al. |
| 2015/0236131 | A1 | 8/2015 | Chang et al. |
| 2016/0133632 | A1 | 5/2016 | Park et al. |
| 2017/0018620 | A1 | 1/2017 | Liu et al. |
| 2017/0154966 | A1 | 6/2017 | Huang et al. |
| 2017/0207126 | A1 | 7/2017 | Ching et al. |
| 2017/0250266 | A1 | 8/2017 | Huang et al. |
| 2018/0040694 | A1 | 2/2018 | Tseng et al. |
| 2018/0138092 | A1 | 5/2018 | Lee et al. |
| 2018/0144988 | A1 | 5/2018 | Liou et al. |
| 2018/0182859 | A1 | 6/2018 | Lee et al. |
| 2018/0248030 | A1 | 8/2018 | Cheng et al. |
| 2019/0006345 | A1* | 1/2019 | Wang ................ H10D 84/0151 |

* cited by examiner

METAL GATE STRUCTURE CUTTING PROCESS

PRIORITY

This is a divisional of U.S. patent application Ser. No. 17/181,217, filed on Feb. 22, 2021, which is a continuation of U.S. patent application Ser. No. 16/536,913, filed on Aug. 9, 2019, now issued U.S. Pat. No. 10,930,564, which claims priority to U.S. Prov. Pat. App. Ser. No. 62/725,818 filed on Aug. 31, 2018, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, has been the replacement of the typically polysilicon gate with a metal gate to improve device performance with the decreased feature sizes. One process of forming a metal gate is termed a replacement gate or "gate-last" process in which the metal gate is fabricated "last" which allows for reduced number of subsequent processes, including high temperature processing, that must be performed after formation of the gate. By way of example, a metal gate fabrication process may include a metal gate structure deposition followed by a subsequent metal gate structure cutting process. However, there are challenges to implementing such IC fabrication processes, especially dielectric material filled between metal gate segments for isolation may extend into inter-layer dielectric (ILD) layer between source/drain (S/D) regions. During S/D contact formation, the existence of the dielectric material reduces S/D contact landing area and enlarges S/D contact resistance, which also deteriorates device integration. An object of the present disclosure seeks to resolve this issue, among others.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
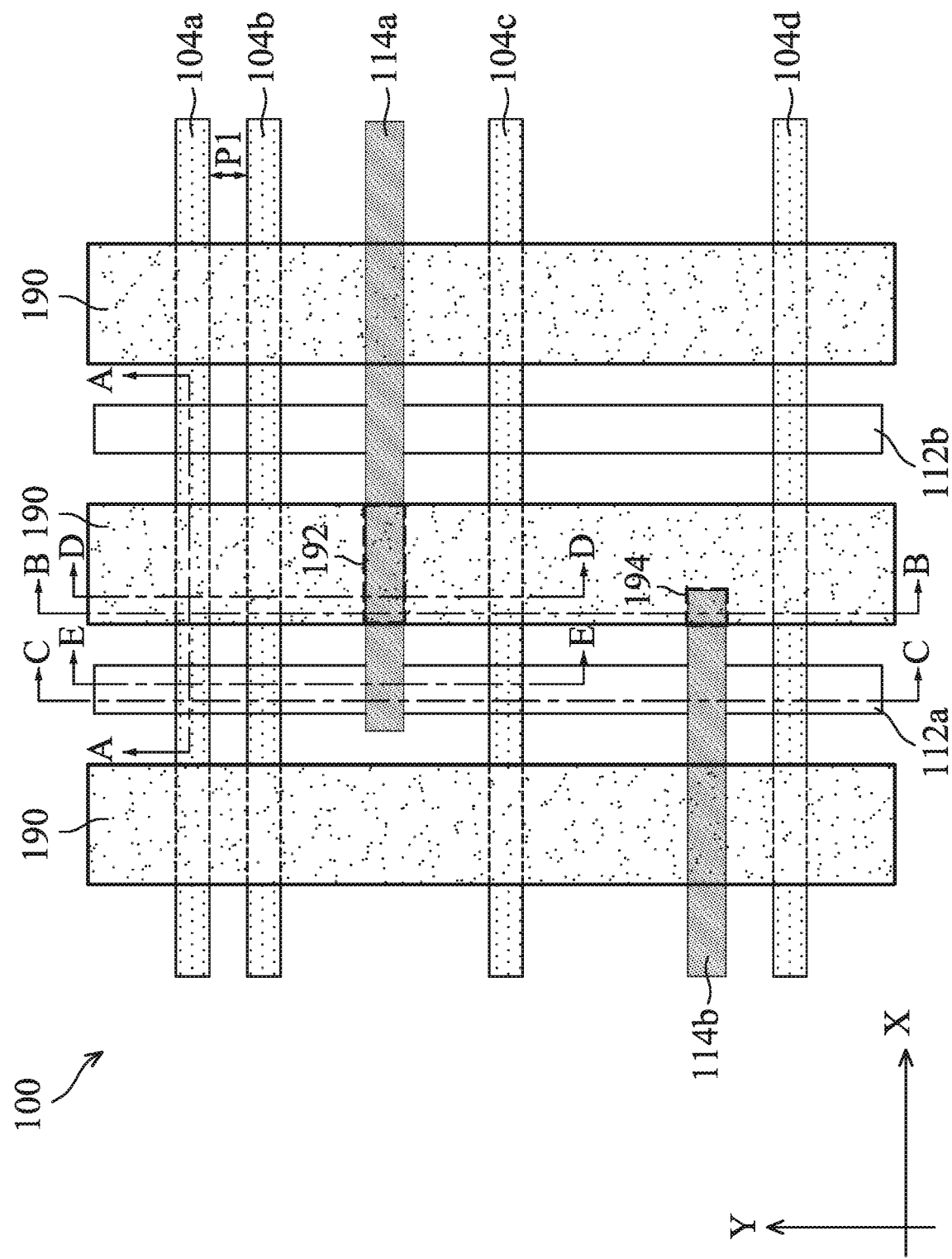
FIG. 1A shows a top view of a semiconductor structure implemented with a cut metal gate process, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating FinFET semiconductor devices with a cut metal gate process using an isolation material for isolation among gate segments, and followed by a selective etching process to recess the isolation material remained in areas offset from the gate segments (e.g., in an ILD layer between S/D features), which beneficially enlarges S/D contact landing area and reduces S/D contact resistance.

A cut metal gate (CMG) process refers to a fabrication process where after a metal gate (e.g., a high-k metal gate or HK MG) replaces a dummy gate structure (e.g., a polysilicon gate), the metal gate is cut (e.g., by an etching process) to separate the metal gate into two or more gate segments. Each gate segment functions as a metal gate for an individual transistor. An isolation material is subsequently filled into trenches between adjacent portions of the metal gate. These trenches are referred to as cut metal gate trenches, or CMG trenches, in the present disclosure. To ensure the metal gate would be completely cut, CMG trenches often further extend into adjacent areas, such as an ILD layer covering sidewalls of the metal gate. Therefore, the isolation material filling CMG trenches subsequently remains in the ILD layer.

The isolation material often has the same height as the metal gate, which may be taller than adjacent S/D features. An etching process to create a S/D contact hole in the ILD layer may not have enough etching selectivity towards the isolation material, such that the isolation material protrudes from the S/D contact hole. A protruded isolation material shadows adjacent S/D features and reduces S/D contact landing area, such that a S/D contact formed in the S/D contact hole may not effectively land on S/D features.

A process flow according to the present disclosure includes at least a CMG process and a selective etching process to recess isolation material in S/D contact holes. The CMG process divides the metal gate into multiple gate segments. The selective etching process recesses the isolation material below a certain height of the S/D features. By utilizing this process flow, top surfaces and sidewalls (such as upward-facing sidewalls) of the S/D features are better exposed in S/D contact holes, which allows larger S/D contact landing area and smaller S/D contact resistance and also enlarges process window for S/D contact formation.

Figure 1B:
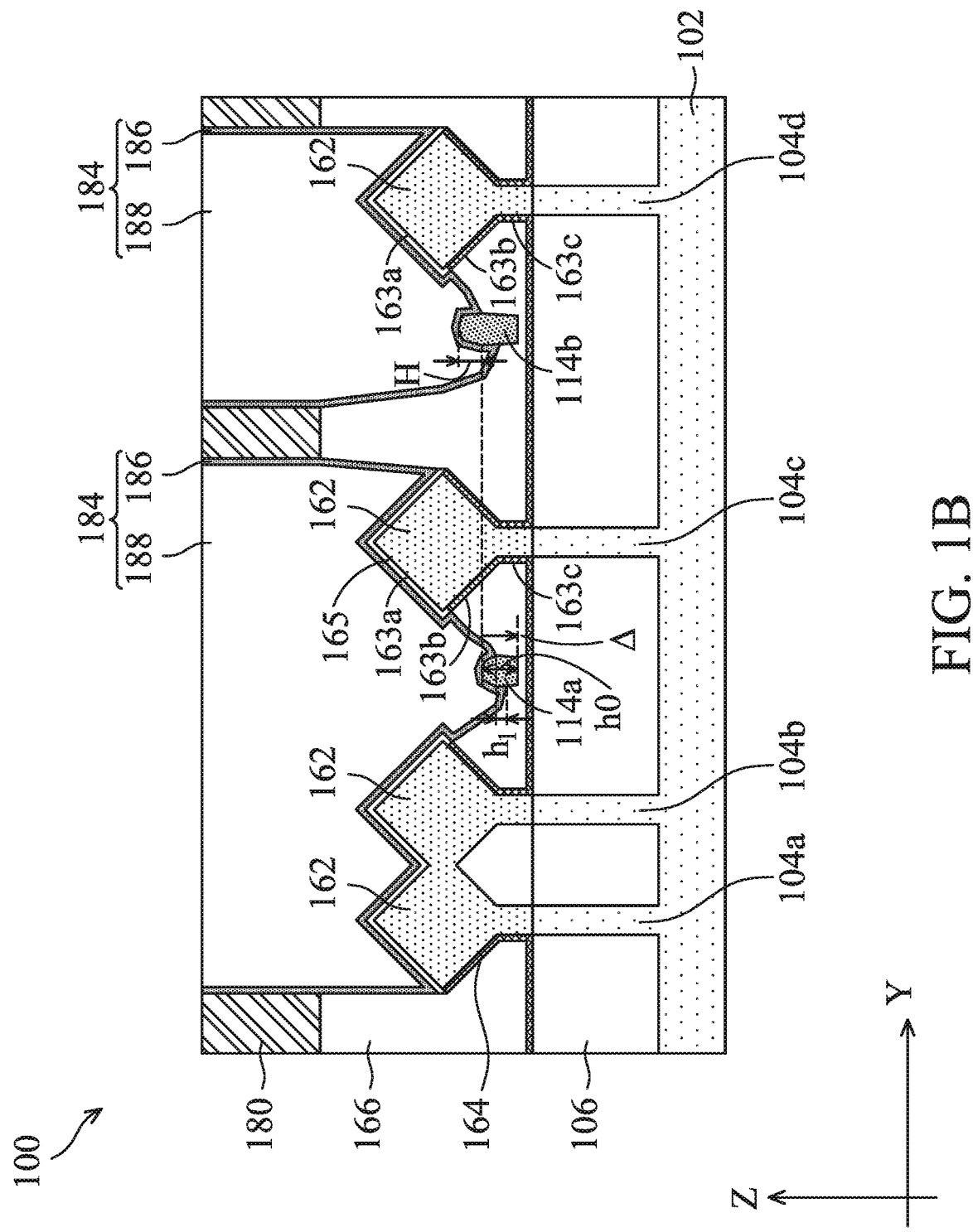
FIGS. 1B, 1C, and 1D show cross-sectional views of the structure in FIG. 1A, in accordance with some embodiments.
Figure 1C:
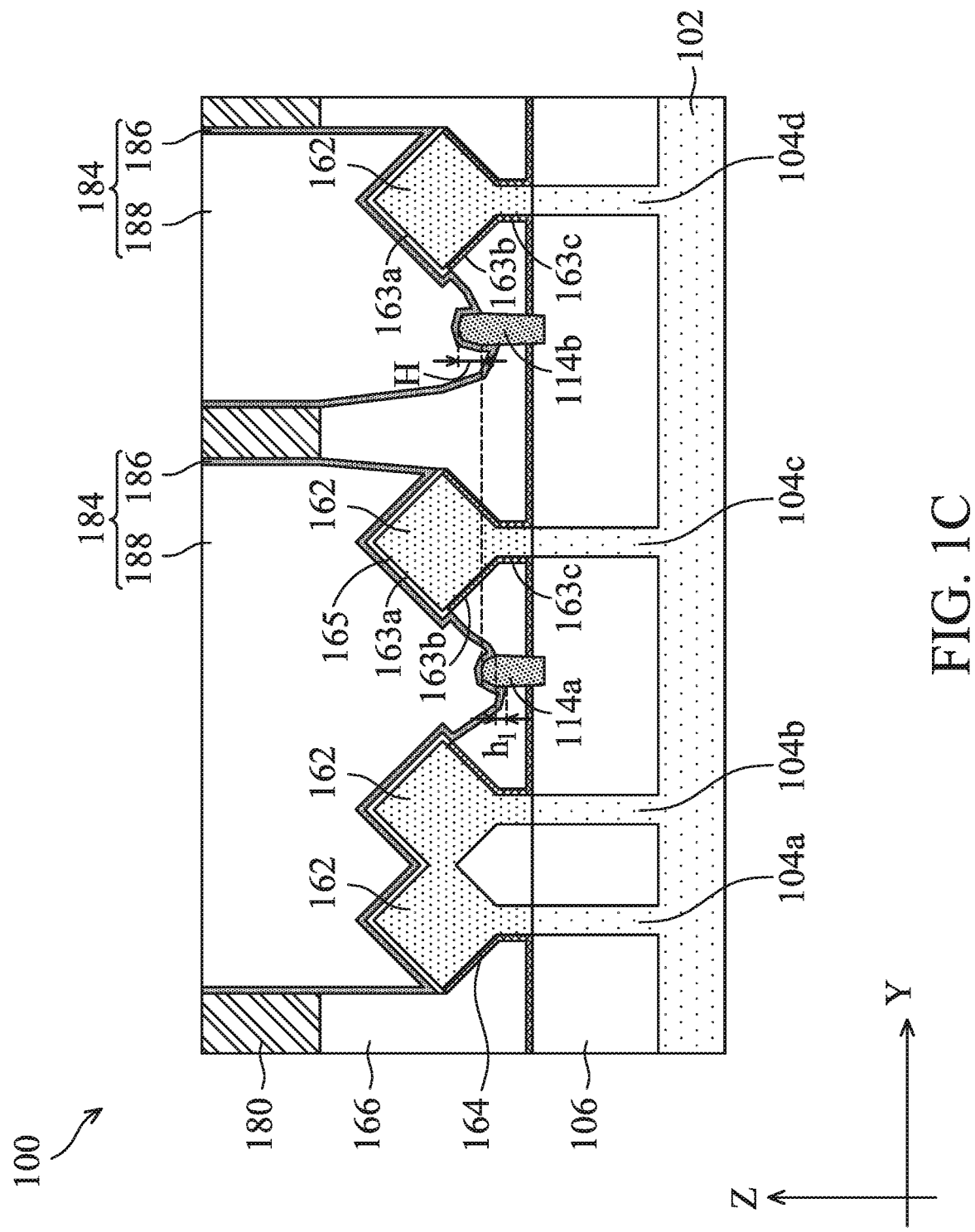
Figure 1D:
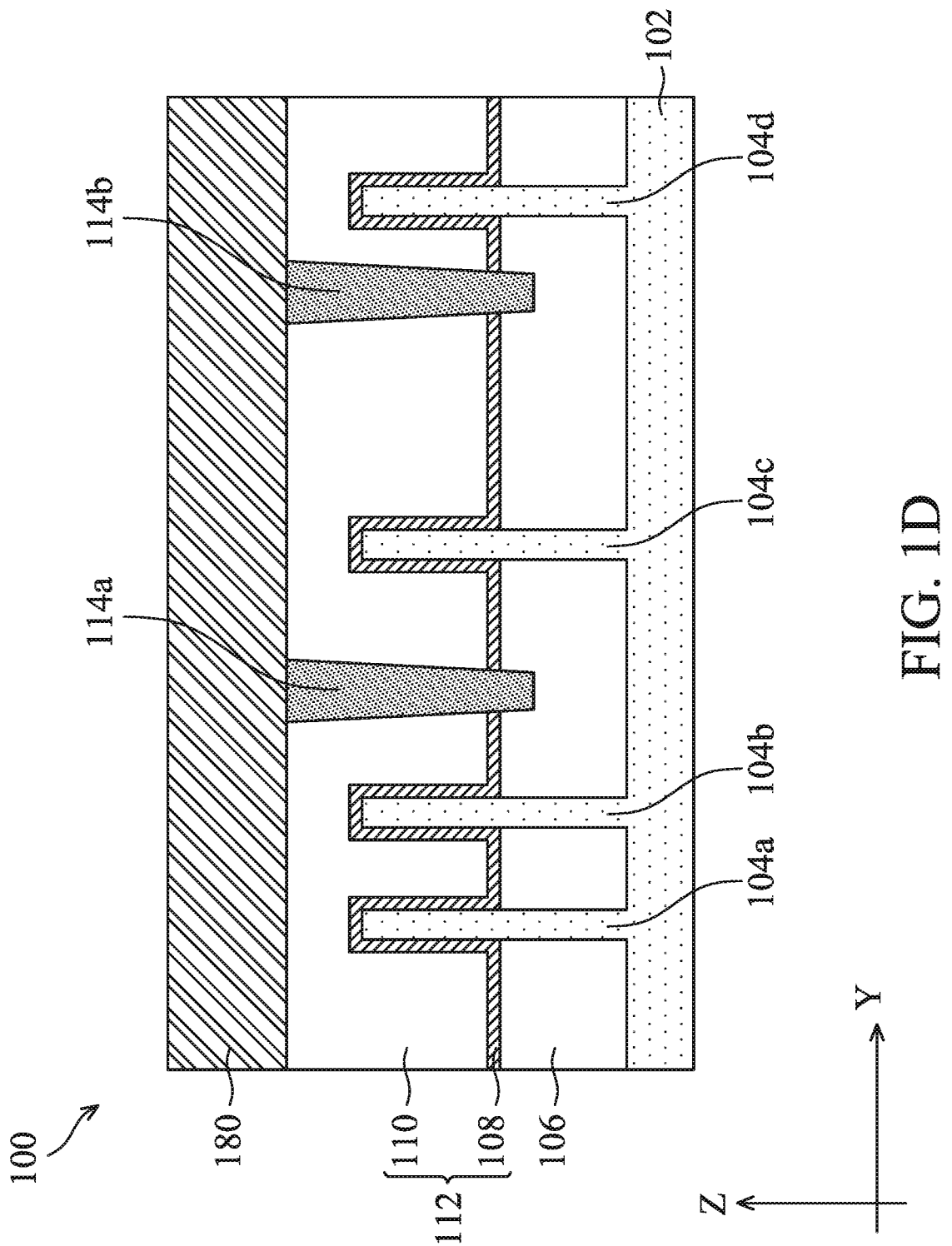

FIG. 1A illustrates a top view of a semiconductor device (or semiconductor structure) 100. FIG. 1B illustrates a cross-sectional view of the device 100 along the B-B line of FIG. 1A. FIG. 1D illustrates a cross-sectional view of the device 100 along the C-C line of FIG. 1A.

Referring to FIGS. 1A and 1B, the device 100 includes a substrate 102, a plurality of fins protruding out of the substrate 102 including fins 104a, 104b, 104c, and 104d (collectively, fins 104), an isolation structure 106 over the substrate 102 and between the fins 104, and a plurality of gate structures disposed over the fins 104 and the isolation structure 106 including gate structures 112a and 112b (collectively, gate structures 112).

The fins 104 are oriented lengthwise along X direction and spaced from each other along Y direction perpendicular to the X direction. Each of the fins 104 may be designed for forming n-type FinFETs or p-type FinFETs. The gate structures 112 are oriented lengthwise along the Y direction and spaced from each other along the X direction. The gate structures 112 engage the fins 104a, 104b, 104c, and 104d in their respective channel regions to thereby form FinFETs.

The device 100 further includes S/D features 162. The S/D features 162 are epitaxially grown semiconductor features. During an epitaxial growing process, an S/D feature 162 may form multiple sidewalls, such as sidewalls 163a, 163b, and 163c in the illustrated embodiment. Depending on a sidewall's norm direction, if a norm points upwardly, the respective sidewall is termed an upward-facing sidewall (e.g., sidewall 163a); if a norm points downwardly, the respective sidewall is termed a downward-facing sidewall (e.g., sidewall 163b); if a norm points generally horizontally, the respective sidewall is termed a vertical sidewall (e.g., sidewall 163c). The S/D features 162 are disposed on each of the fins 104 in their respective S/D regions. The fins 104a and 104b have an edge-to-edge spacing P1 along the Y direction. In an embodiment, P1 ranges from about 20 to about 30 nm, which is smaller than traditional fin configurations such that respective S/D features 162 of the fins 104a and 104b merge.

The device 100 further includes one or more dielectric layers, such as a contact etch stop layer (CESL) 164 over the isolation structure 106 and partially disposed on sidewalls of the S/D features 162, a first ILD layer 166 disposed over the isolation structure 106, and a second ILD layer 180 disposed over the first ILD layer 166. The device 100 further includes one or more conductive materials 184 formed in contact holes opened through the ILD layers 180 and 166, engaging the S/D features 162.

Still referring to FIGS. 1A and 1B, the device 100 further includes a plurality of dielectric features arranged lengthwise along the X direction including dielectric features 114a and 114b (collectively, dielectric features 114). In the illustrated embodiment, the dielectric feature 114a is disposed between fins 104b and 104c and intersects gate structures 112a and 112b, and the dielectric features 114b is disposed between fins 104c and 104d and intersects gate structure 112a (but not gate structure 112b). Each of the dielectric features 114 fills in CMG trenches, and therefore isolates the gate structures 112 that it intersects into at least two portions (or referred to as gate segments). Therefore, the dielectric features 114 is also referred to as the isolation feature 114. In the illustrated embodiment, the dielectric features 114a and 114b collectively divide the gate structure 112a into three gate segments, and the dielectric feature 114a further divides the gate structure 112b into two gate segments.

Referring to FIGS. 1A and 1D, each gate structure 112 includes a high-k dielectric layer 108 and a conductive layer 110 over the high-k dielectric layer 108. The conductive layer 110 includes one or more layers of metallic materials. Therefore, each gate structure 112 is also referred to as a high-k metal gate (or HK MG) 112. The gate structures 112 may further include an interfacial layer (not shown) under the high-k dielectric layer 108. In various embodiments, each of the dielectric features 114a and 114b expands along the Y direction at least from one edge of a gate structure 112 to an adjacent edge of the gate structure 112 and expands along the Z direction from a top surface of the gate structure 112 into a top portion of the isolation structure 106. In the illustrated embodiment, the dielectric features 114a and 114b separates the gate structure 112a into left, middle, and right portions. The left portion engages two fins 104a and 104b to form one transistor, the middle portion engages the fin 104c to form another transistor, and the right portion engages the fin 104d to form yet another transistor.

Referring to FIG. 1B, the dielectric features 114a and 114b also extend to a region offset from the gate structure 112. In the illustrated embodiment, the dielectric feature 114a is disposed between the S/D features 162 of the fins 104b and 104c, and the dielectric feature 114b is disposed between the S/D features 162 of the fins 104c and 104d. Compared with FIG. 1D, where a bottom portion of the dielectric feature 114 extends into the isolation structure 106, while in FIG. 1B, a bottom portion of the dielectric feature 114 is embedded in the first ILD layer 166. This is because etchants selected to etch the metal gate structure 112 as well as the first ILD layer 166 during the formation of a CMG trench may have inequivalent etching rates among these material, such that different etching rates at different locations of the CMG trench may result in different etching depth. In other words, a bottom surface of the dielectric feature 114 along the X direction may have a step profile with a step height ranging from about 2 nm to about 10 nm in some embodiments. In some embodiments, the bottom surface of the dielectric feature 114 is above the top surface of the isolation structure 106 with a gap A about 5% to about 20% of a height h0 of the dielectric feature 114a in the S/D region, as shown in FIG. 1B. In some alternative embodiments, a bottom portion of the dielectric feature 114 may also extend into the isolation structure 106, as shown in FIG. 1C. A top portion of the dielectric feature 114 protrudes from the ILD layer 166 and intrudes into a bottom surface of the conductive material 184. The first ILD layer 166 disposed on opposing sidewalls of the dielectric feature 114 may have the same height or inequivalent heights. In the illustrated embodiment, levels of the first ILD layer disposed on opposing sidewalls of the dielectric feature 114 are uneven. In the illustrated embodiment, the first ILD layer 166 disposed on the left sidewall of the dielectric feature 114a is lower than on the right sidewall, such as a height difference h1 about 10% to about 60% of the height h0 of the dielectric feature 114a in the S/D region, such as ranging from about 1 nm to about 5 nm. This is mainly due to an etching loading effect of a wider opening on the left side of the dielectric feature 114a in the S/D contact hole than on the right side, such that the first ILD layer 166 is recessed more on the left side of the dielectric feature 114a than on its right side.

Compared with FIG. 1D, where a top surface of the dielectric features 114 interposed between gate segments is substantially coplanar with a top surface of the gate structure 112, while in FIG. 1B, the dielectric feature 114 is recessed under the conductive materials 184. Still referring to FIG. 1B, in some embodiments, the dielectric feature 114 may be recessed for at least 50 nm in the Z direction. In the illustrated embodiment, each of the recessed dielectric feature 114 is below the upward-facing sidewall 163a of an adjacent S/D feature 162. By recessing the dielectric feature 114, upward-facing sidewalls 163a won't be shadowed, which provides larger landing area for the conductive materials 184 to sufficiently contact upward-facing sidewalls 163a. In the illustrated embodiment, top portions of the downward-facing sidewalls 163b are also exposed, which provides extra contacting area from sides of the S/D features 162.

Among dielectric features 114, there may be height differences. In the illustrated embodiment, the dielectric feature 114b is taller than the dielectric feature 114a, such as a height difference H ranging from about 10 nm to about 40 nm in some embodiments. Referring to FIG. 1A, regions 190 shows where S/D contact holes are formed and subsequently where S/D contact features to fill therein. The dielectric feature 114a extends through a whole S/D contact hole with an overlapping area denoted as dashed box 192. The dielectric feature 114b slightly extends into a S/D contact hole with a much smaller overlapping area denoted as dashed box 194. Therefore, when etchants are applied through the contact holes to selectively etch dielectric features 114a and 114b, the dielectric feature 114a has a larger opening area (dashed box 192) to receive more etchants than the dielectric feature 114b (dashed box 194). Further, etching byproducts are also easier to dissipate through a larger opening area. Accordingly, the dielectric feature 114a is recessed faster than the dielectric feature 114b.

In some embodiments, each dielectric feature 114 may be lower than the bottommost portion of the upward-facing sidewall 163a of the respective adjacent S/D feature 162, but higher than a bottommost portion of the respective downward-facing sidewall 163b. In some alternative embodiments, each dielectric feature 114 may be lower than the bottommost portion of the downward-facing sidewall 163b of the respective adjacent S/D feature 162. In yet some alternative embodiments, the dielectric feature 114a may be below the bottommost portion of the downward-facing sidewall 163b of the respective adjacent S/D feature 162 and the dielectric feature 114b is higher than the bottommost portion of the downward-facing sidewall 163b but lower than the bottommost portion of the upward-facing sidewall 163a.

The components of the device 100 are further described below. The substrate 102 is a silicon substrate in the present embodiment. Alternatively, the substrate 102 may comprise another elementary semiconductor, such as germanium; a compound semiconductor including silicon carbide, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

The fins 104 may comprise one or more semiconductor materials such as silicon, germanium, silicon carbide, gallium arsenide, gallium phosphide, indium phosphide, indium arsenide, indium antimonide, silicon germanium, gallium arsenide phosphide, aluminum indium phosphide, aluminum gallium arsenide, gallium indium arsenide, gallium indium phosphide, and gallium indium arsenide phosphide. In an embodiment, the fins 104 may include alternately stacked layers of two different semiconductor materials, such as layers of silicon and silicon germanium alternately stacked. The fins 104 may additionally include dopants for improving the performance of the device 100. For example, the fins 104 may include n-type dopant(s) such as phosphorus or arsenic, or p-type dopant(s) such as boron or indium.

The isolation structure 106 may comprise silicon oxide, silicon nitride, silicon oxynitride, fluoride-doped silicate glass (FSG), a low-k dielectric material, and/or other suitable insulating material. The isolation structure 106 may be shallow trench isolation (STI) features. Other isolation structure such as field oxide, LOCal Oxidation of Silicon (LOCOS), and/or other suitable structures are possible. The isolation structure 106 may include a multi-layer structure, for example, having one or more thermal oxide liner layers adjacent to the fins 104.

The high-k dielectric layer 108 may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof.

The conductive layer 110 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials.

The dielectric feature 114 may include one or more dielectric materials, such as silicon nitride, silicon oxide, silicon oxynitride, fluoride-doped silicate glass (FSG), a low-k dielectric material, and/or other suitable insulating material; and may be formed by CVD (chemical vapor deposition), PVD (physical vapor deposition), ALD (atomic layer deposition), or other suitable methods.

The CESL 164 may comprise silicon nitride, silicon oxynitride, silicon nitride with oxygen (O) or carbon (C)

elements, and/or other materials; and may be formed by CVD, PVD, ALD, or other suitable methods. The first ILD layer 166 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first ILD layer 166 may be formed by PECVD (plasma enhanced CVD), FCVD (flowable CVD), or other suitable methods. The second ILD layer 180 is another dielectric layer and may comprise TEOS oxide, un-doped silicate glass, or doped silicon oxide such as BPSG, FSG, PSG, BSG, and/or other suitable dielectric materials. The ILD layers 166 and 180 may include different material compositions. The dielectric layer 180 may be formed by PECVD, FCVD, or other suitable methods.

The conductive materials 184 includes a barrier layer 186 such as TaN or TiN and a metal fill layer 188 such as Al, Cu, or W, in some embodiments. The barrier layer 186 may conformally cover the sidewalls of the dielectric layer 180, the first ILD layer 166, silicide layer 165, dielectric features 114a and 114b. The barrier layer 186 may be deposited using a process such as CVD, PVD, PECVD, ALD, or other suitable methods. The metal fill layer 188 may be deposited using CVD, PVD, plating, or other suitable methods.

Figure 2A:
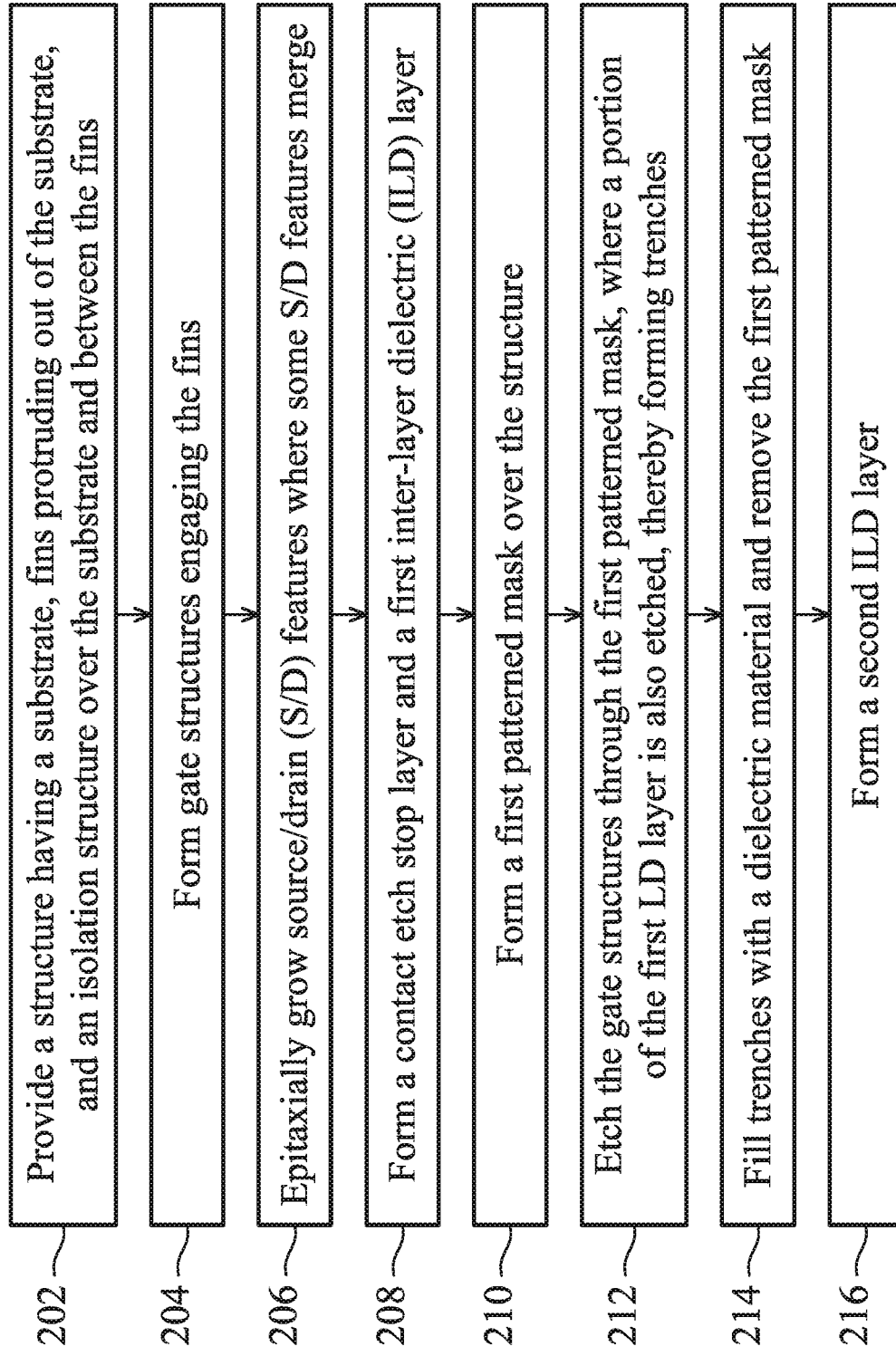
FIGS. 2A, 2B, and 2C show a flow chart of a method for forming the structure shown in FIGS. 1A-1D, according to aspects of the present disclosure.
Figure 2B:
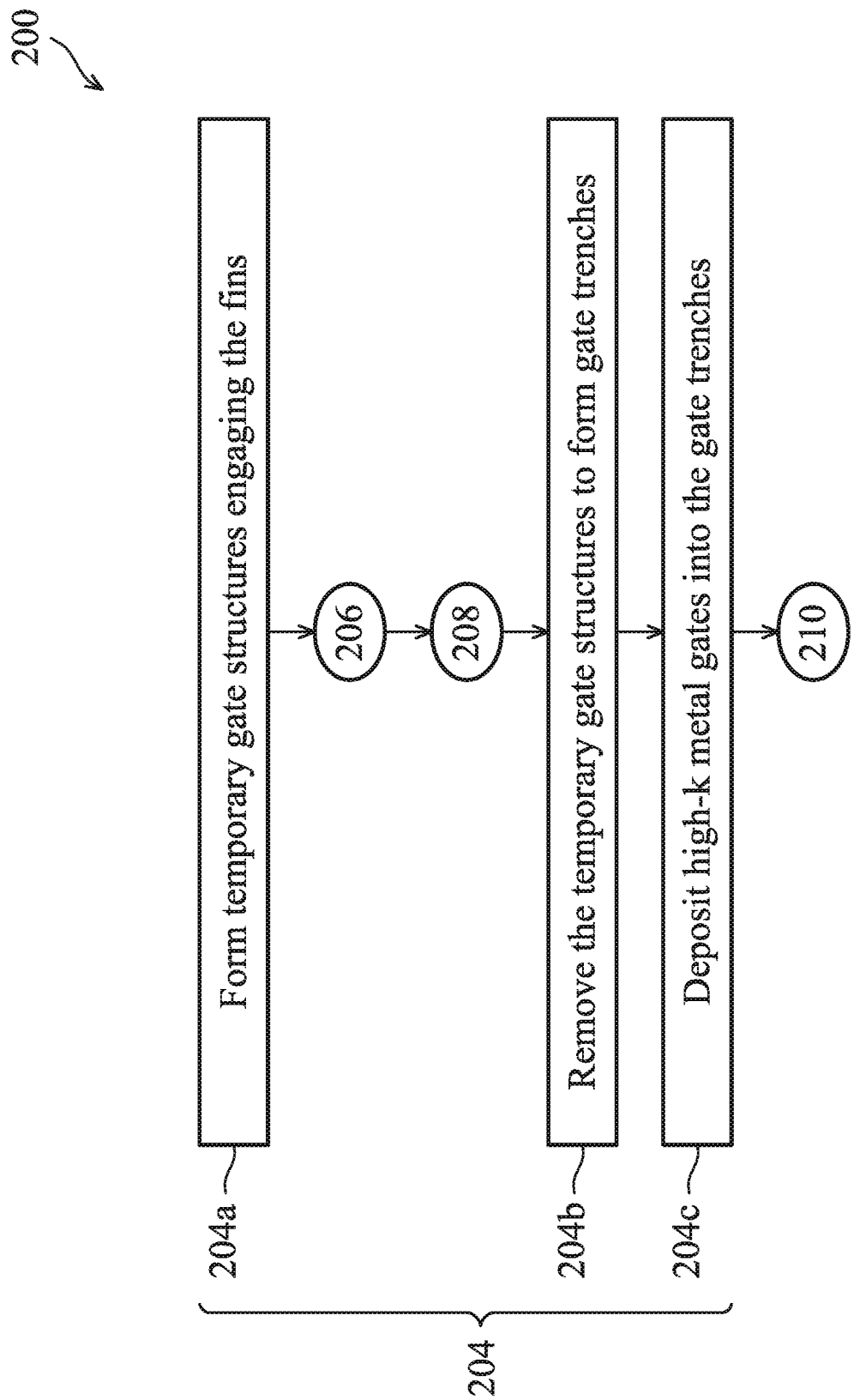
Figure 2C:
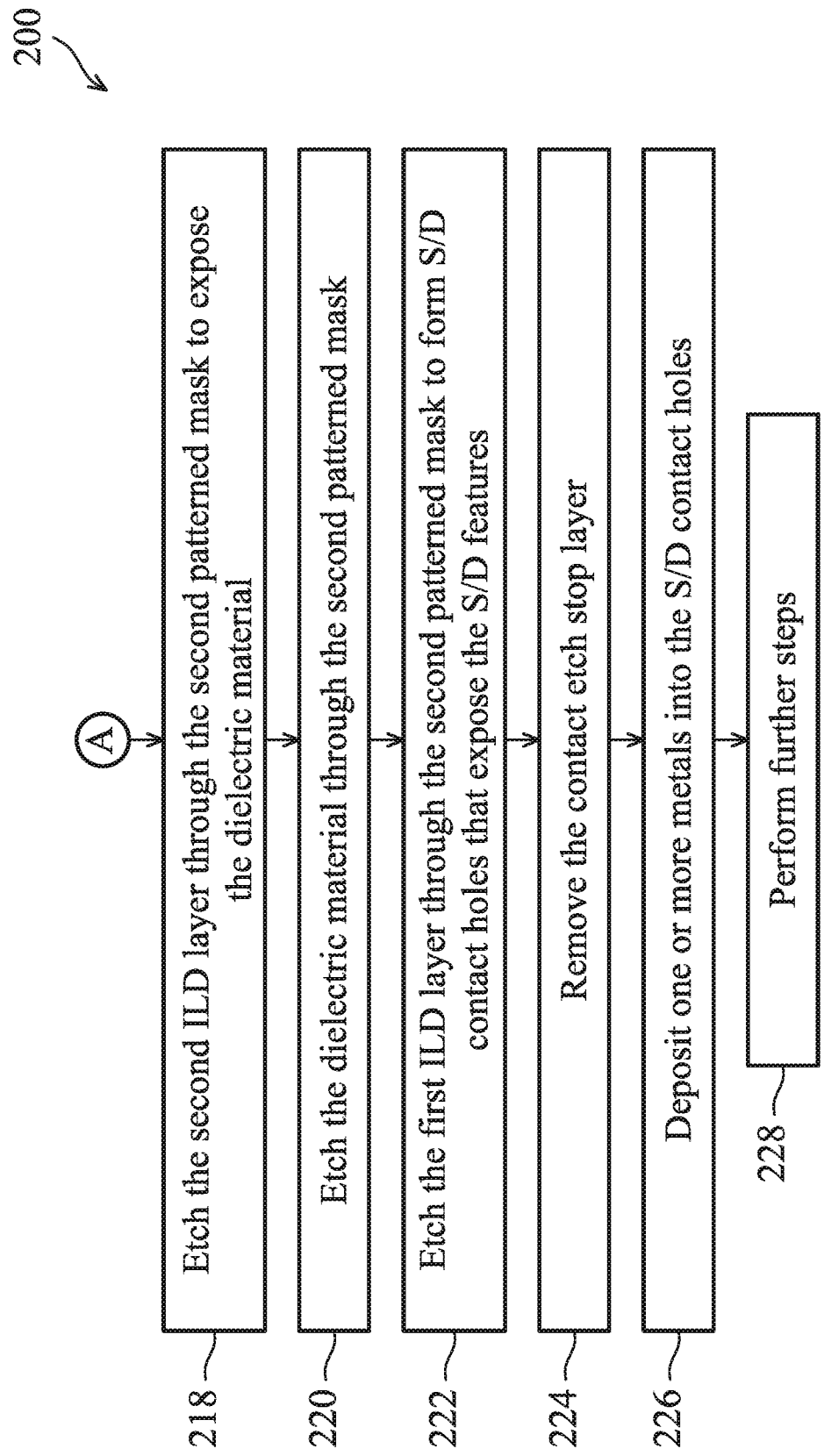

FIGS. 2A, 2B, and 2C illustrate a flow chart of a method 200 for forming the semiconductor device 100 in accordance with an embodiment. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-17, which illustrate various cross-sectional views, such as along the A-A line, D-D line, and E-E line of the semiconductor device 100 during fabrication steps according to the method 200. For the sake of simplicity, cross-sectional views along the D-D line or E-E line of the semiconductor device 100 showing less fins are used instead of along the B-B line or C-C line.

Figure 3:
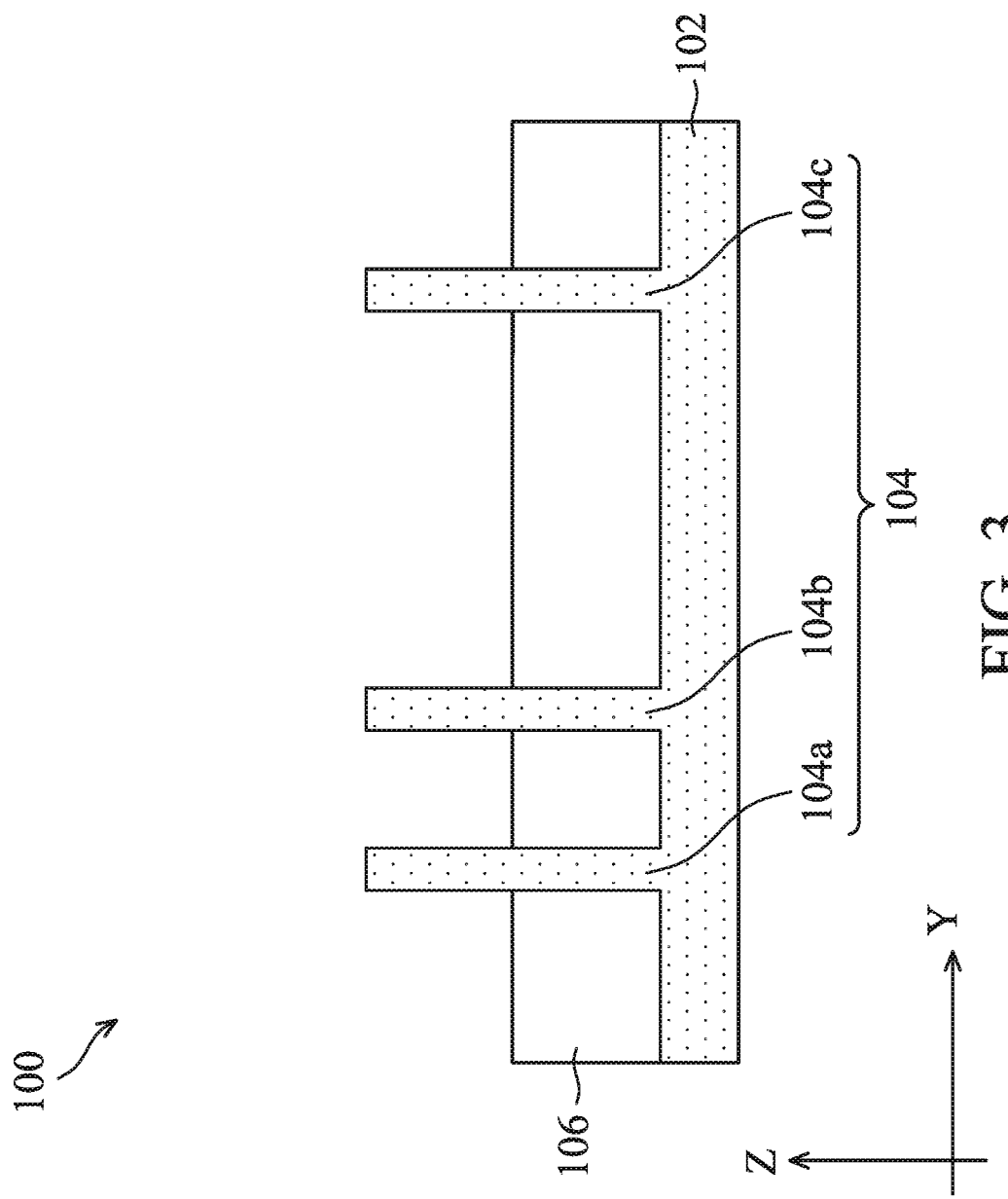
FIGS. 3, 4A, 4B, 5A, 5B, 6A, 6B, 7A, 7B, 8A, 8B, 9A, 9B, 10A, 10B, 11A, 11B, 12, 13, 14, 15, 16, 17, and 18 illustrate cross-sectional views of a semiconductor structure during a fabrication process according to the method of FIGS. 2A-2C, in accordance with some embodiments.

At operation 202, the method 200 (FIG. 2A) provides, or is provided with, a device structure 100 having a substrate 102, fins 104 (including fins 104a, 104b, and 104c) protruding out of the substrate 102, and an isolation structure 106 over the substrate 102 and between the fins 104, such as shown in FIG. 3. Particularly, FIG. 3 shows a cross-sectional view of the device structure 100 along the E-E line of FIG. 1A. The various materials for the substrate 102, the fins 104, and the isolation structure 106 have been discussed above with reference to FIGS. 1A-1D.

In an embodiment, the substrate 102 may be a wafer, such as a silicon wafer. The fins 104 can be formed by epitaxially growing one or more semiconductor layers over the entire area of the substrate 102 and then patterned to form the individual fins 104. The fins 104 may be patterned by any suitable method. For example, the fins 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 104 by etching the initial epitaxial semiconductor layers. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

The isolation structure 106 may be formed by one or more deposition and etching methods. The deposition methods may include thermal oxidation, chemical oxidation, and chemical vapor deposition (CVD) such as flowable CVD (FCVD). The etching methods may include dry etching, wet etching, and chemical mechanical planarization (CMP).

At operation 204, the method 200 (FIG. 2A) forms gate structures 112 engaging the fins 104. In an embodiment, the operation 204 includes depositing the various layers of the gate structures 112 including the gate dielectric layer 108 and the conductive layer 110, and patterning the various layers to form the gate structures 112 as illustrated in FIGS. 1A and 1C. In a particular embodiment, the operation 204 uses a replacement gate process where it first forms temporary (or dummy) gate structures and then replaces the temporary gate structures with the gate structures 112. An embodiment of the replacement gate process is illustrated in FIG. 2B including operations 204a, 204b, and 204c, which are further discussed below.

Figure 4A:
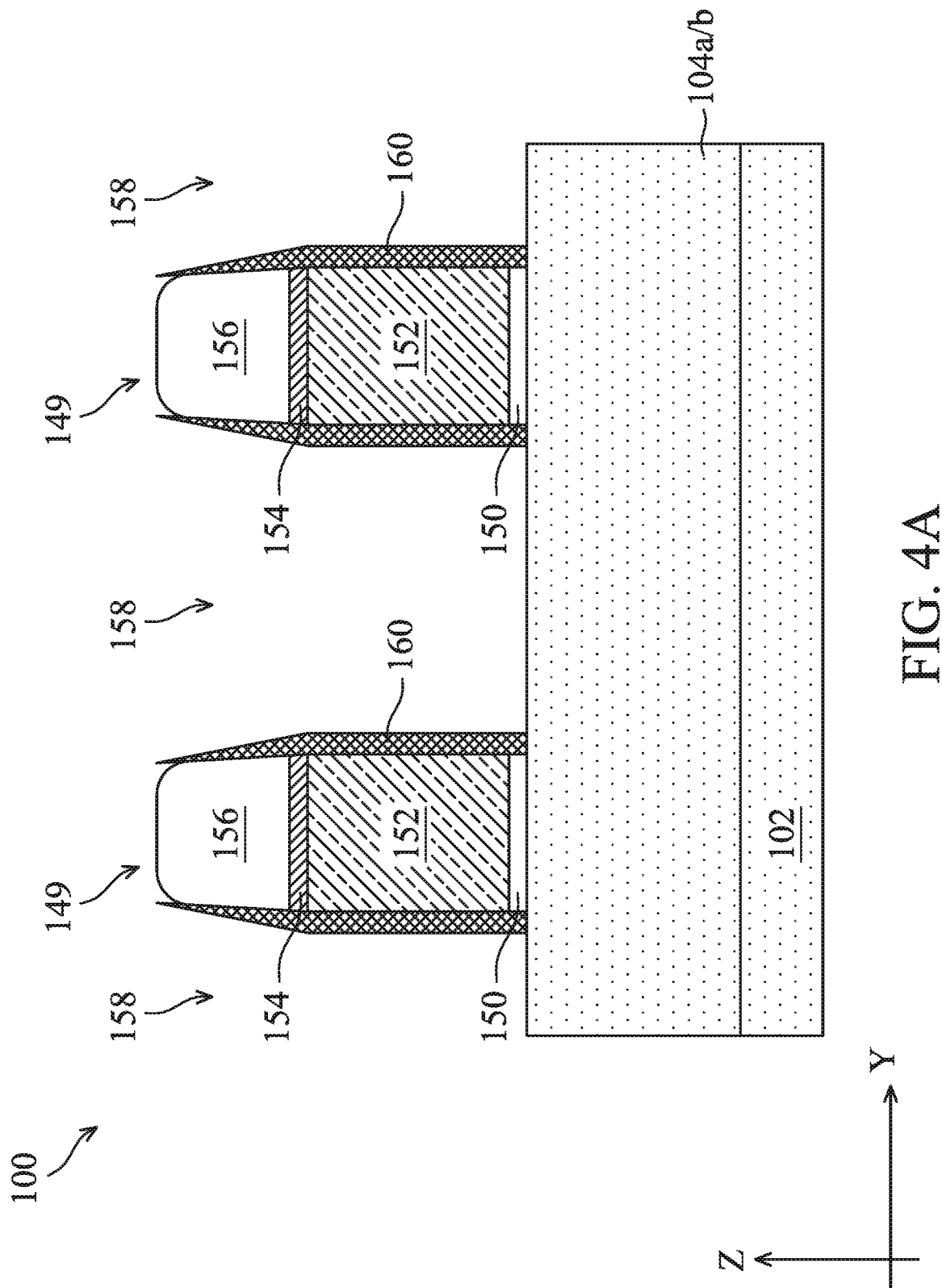
Figure 4B:
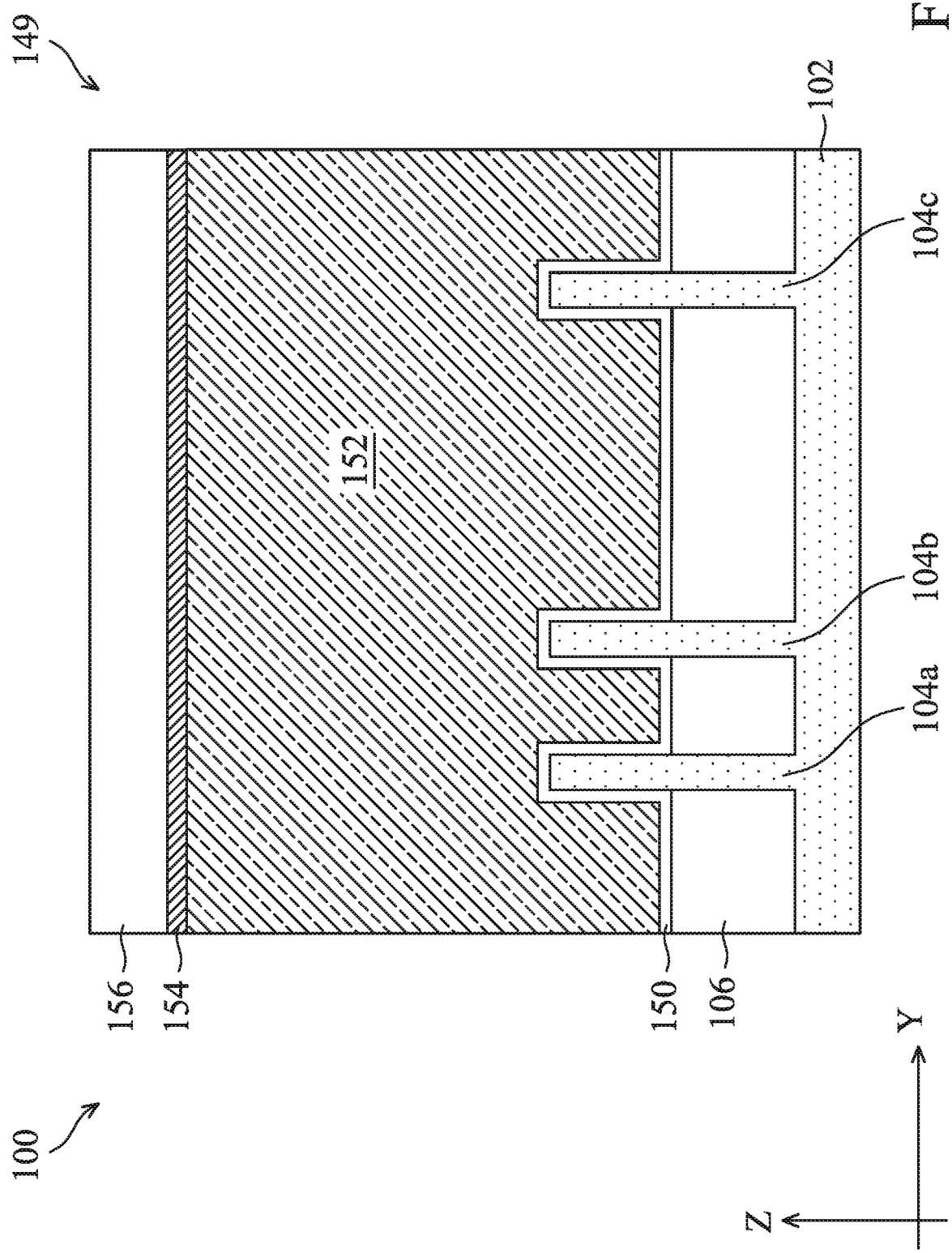

At operation 204a, the method 200 (FIG. 2B) forms temporary gate structures 149 engaging the fins 104 such as shown in FIGS. 4A and 4B, which show cross-sectional views of the device 100 cut along the A-A line and the E-E line of FIG. 1A, respectively. Referring to FIGS. 4A and 4B, each temporary gate structure 149 includes an interfacial layer 150, an electrode layer 152, and two hard mask layers 154 and 156. The operation 204a further forms gate spacers 160 on sidewalls of the temporary gate structures 149.

The interfacial layer 150 may include a dielectric material such as silicon oxide layer (e.g., $SiO_2$) or silicon oxynitride (e.g., SiON), and may be formed by chemical oxidation, thermal oxidation, atomic layer deposition (ALD), CVD, and/or other suitable methods. The gate electrode 152 may include poly-crystalline silicon (poly-Si) and may be formed by suitable deposition processes such as low-pressure chemical vapor deposition (LPCVD) and plasma-enhanced CVD (PECVD). Each of the hard mask layers 154 and 156 may include one or more layers of dielectric material such as silicon oxide and/or silicon nitride, and may be formed by CVD or other suitable methods. The various layers 150, 152, 154, and 156 may be patterned by photolithography and etching processes. The gate spacers 160 may comprise a dielectric material, such as silicon oxide, silicon nitride, silicon oxynitride, silicon carbide, other dielectric material, or combinations thereof, and may comprise one or multiple layers of material. The gate spacers 160 may be formed by depositing a spacer material as a blanket over the isolation structure 106, the fins 104, and the temporary gate structures 149. Then the spacer material is etched by an anisotropic etching process to expose the isolation structure 106, the hard mask layer 156, and a top surface of the fins 104.

Portions of the spacer material on the sidewalls of the temporary gate structures 149 become the gate spacers 160. Adjacent gate spacers 160 provide trenches 158 that expose the fins 104 in the S/D regions of the device 100.

Figure 5A:
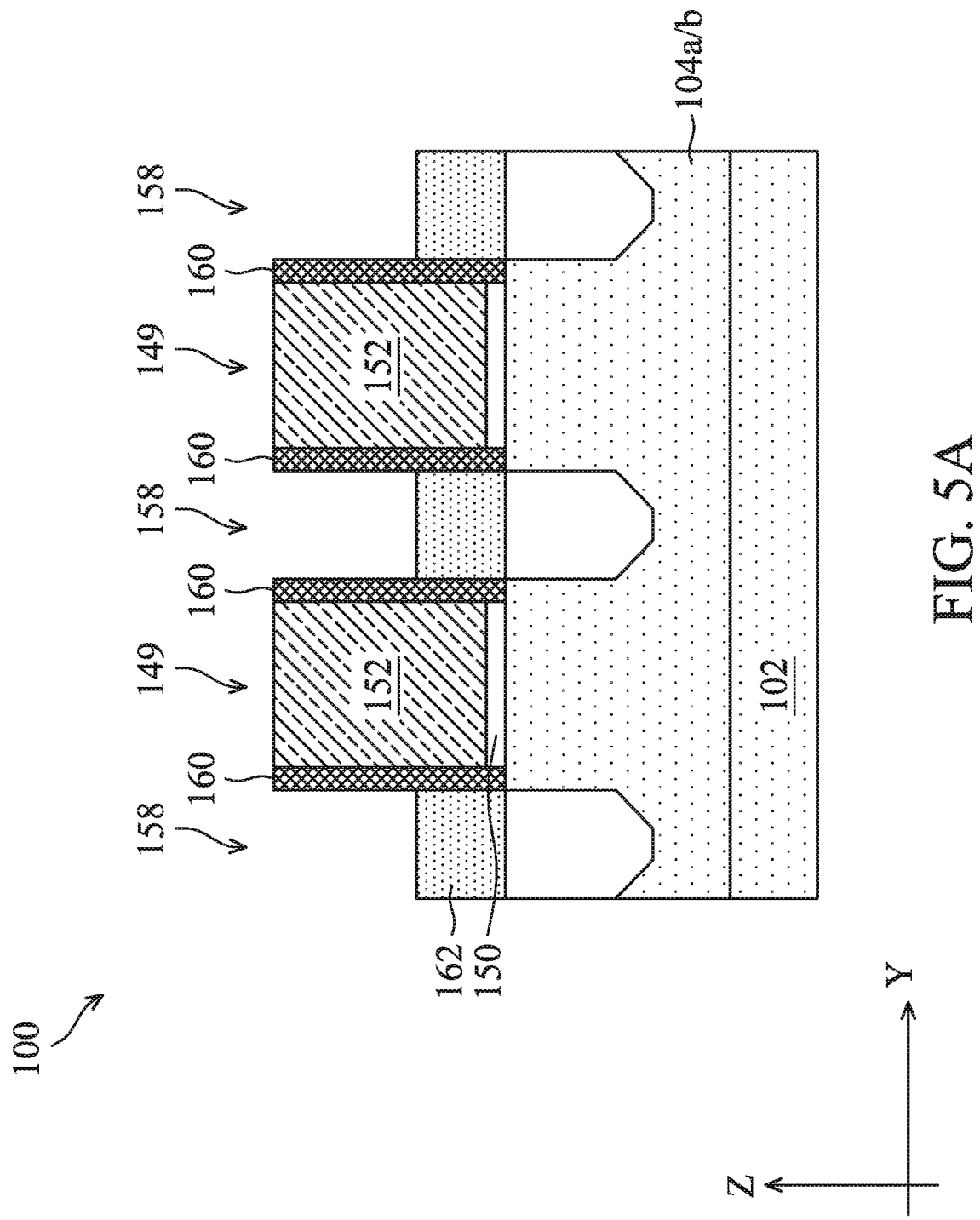
Figure 5B:
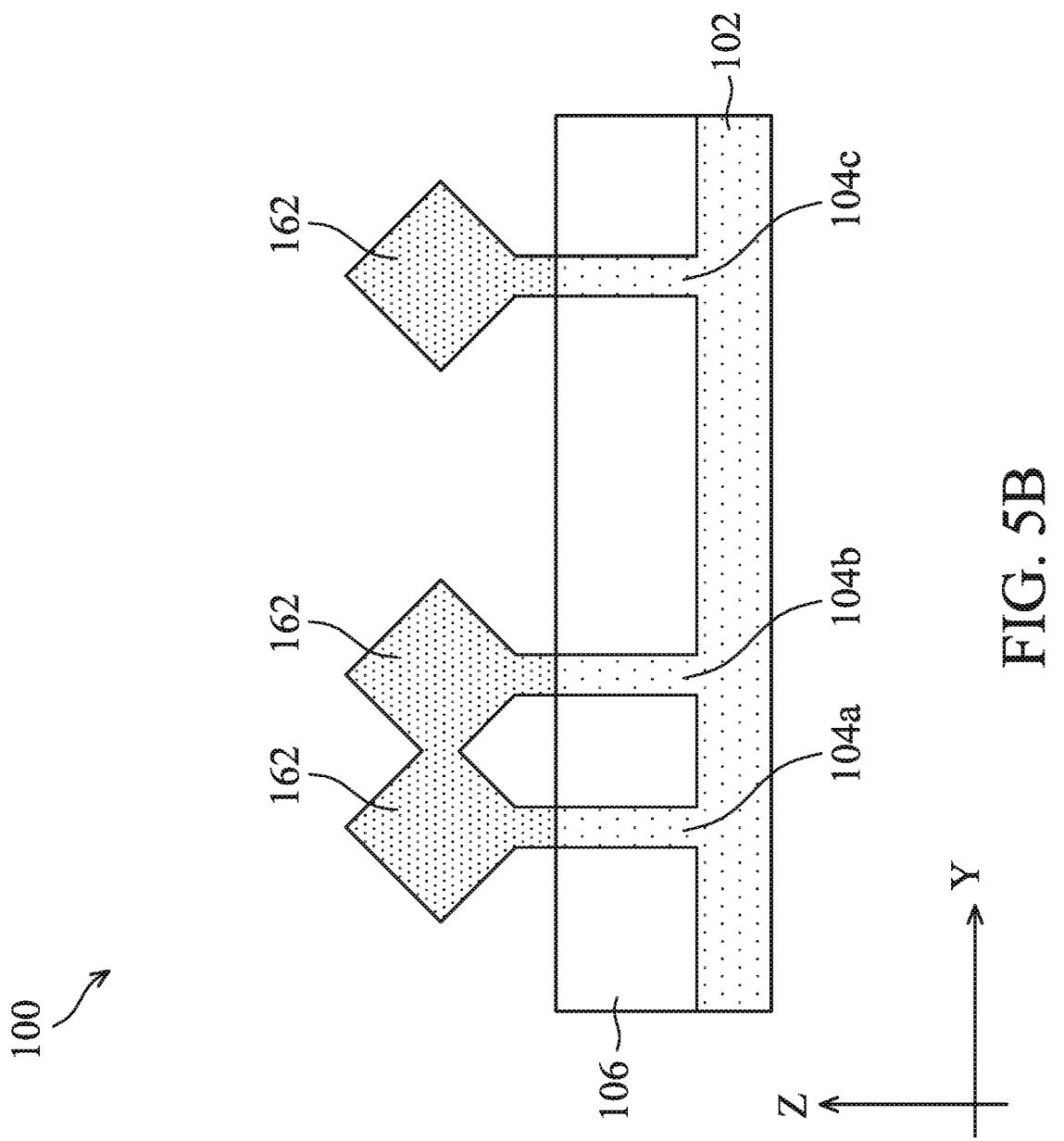

At operation 206, the method 200 (FIGS. 2A and 2B) forms source/drain (or S/D) features 162, such as shown in FIGS. 5A and 5B, which are cross-sectional views of the device 100 along the A-A line and the D-D line of FIG. 1A, respectively. For example, the operation 206 may etch recesses into the fins 104 exposed in the trenches 158, and epitaxially grow semiconductor materials in the recesses. The semiconductor materials may be raised above the top surface of the fins 104, as illustrated in FIGS. 5A and 5B. In the present embodiment, some of the S/D features 162 merge together, such as shown in FIG. 5B.

Figure 6A:
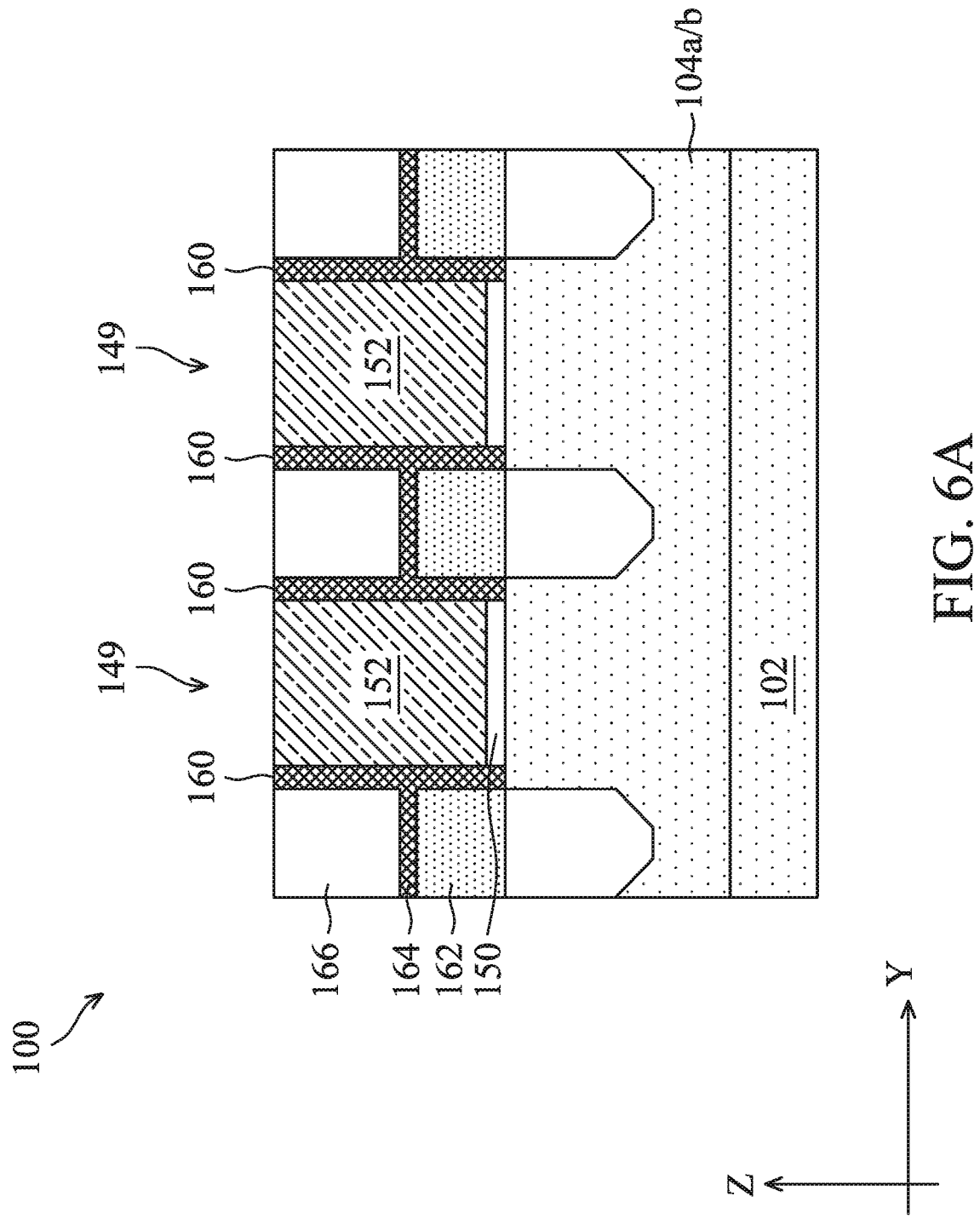
Figure 6B:
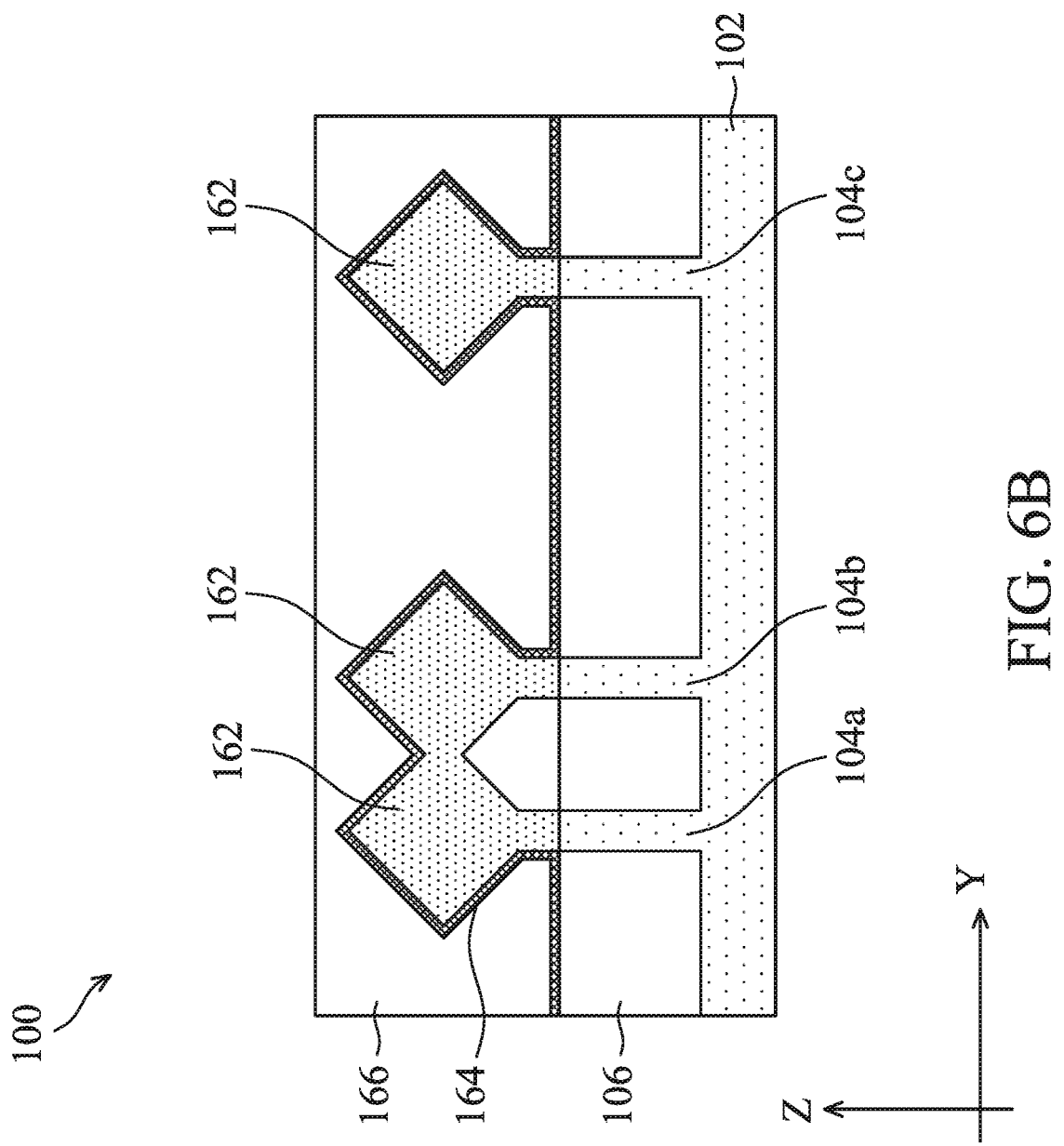

At operation 208, the method 200 (FIGS. 2A and 2B) forms various features including a contact etch stop layer (CESL) 164 over the S/D features 162, and an interlayer dielectric (ILD) layer 166 over the CESL 164, such as shown in FIGS. 6A and 6B, which are cross-sectional views of the device 100 along the A-A line and the B-B line of FIG. 1A, respectively. The CESL 164 may comprise silicon nitride, silicon oxynitride, silicon nitride with oxygen (O) or carbon (C) elements, and/or other materials; and may be formed by CVD, PVD (physical vapor deposition), ALD, or other suitable methods. The ILD layer 166 may comprise tetra-ethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 166 may be formed by PECVD, FCVD, or other suitable methods. The operation 208 may perform one or more CMP processes to planarize the top surface of the device 100, remove the hard mask layers 154 and 156, and expose the electrode layer 152.

Figure 7A:
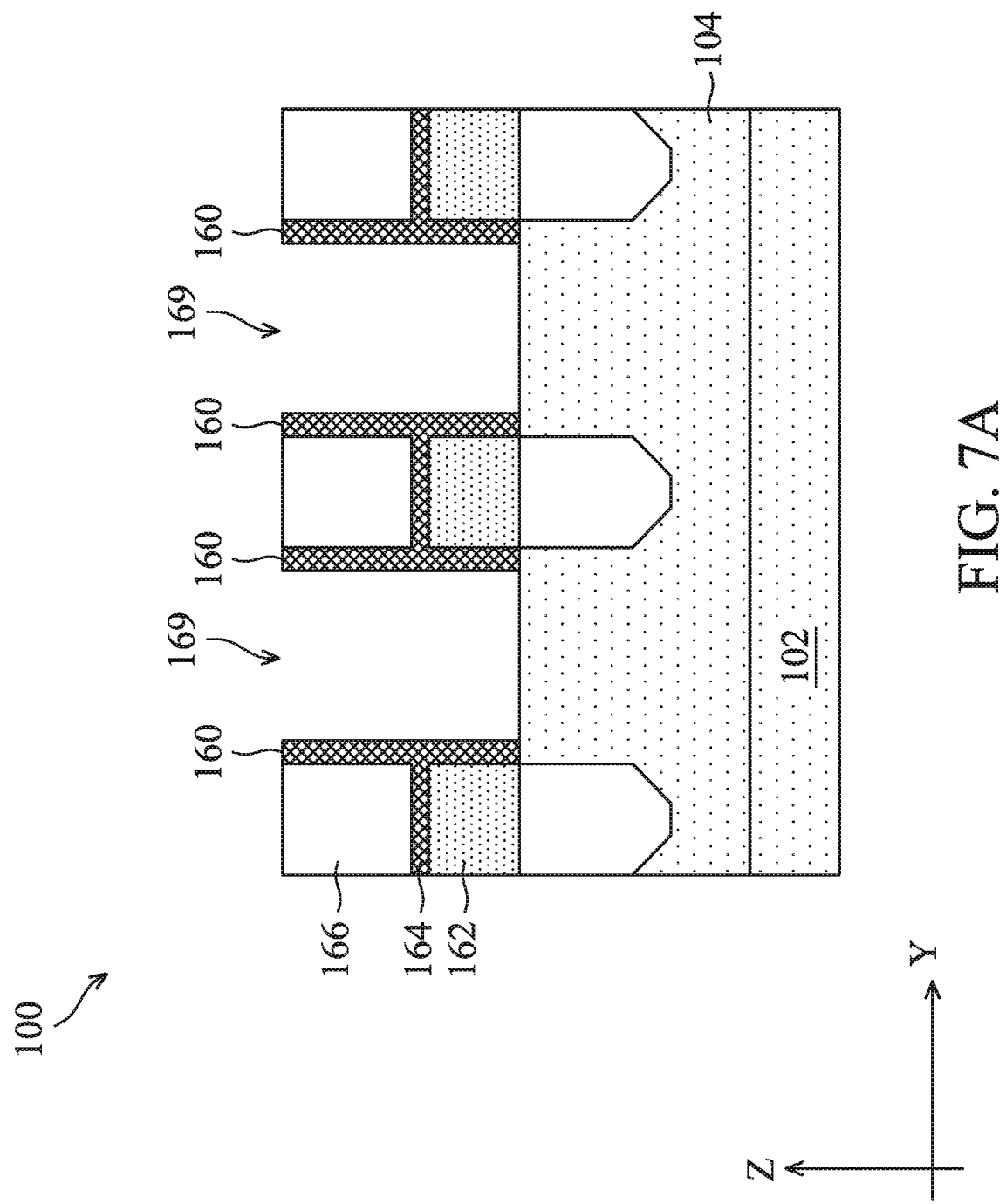
Figure 7B:
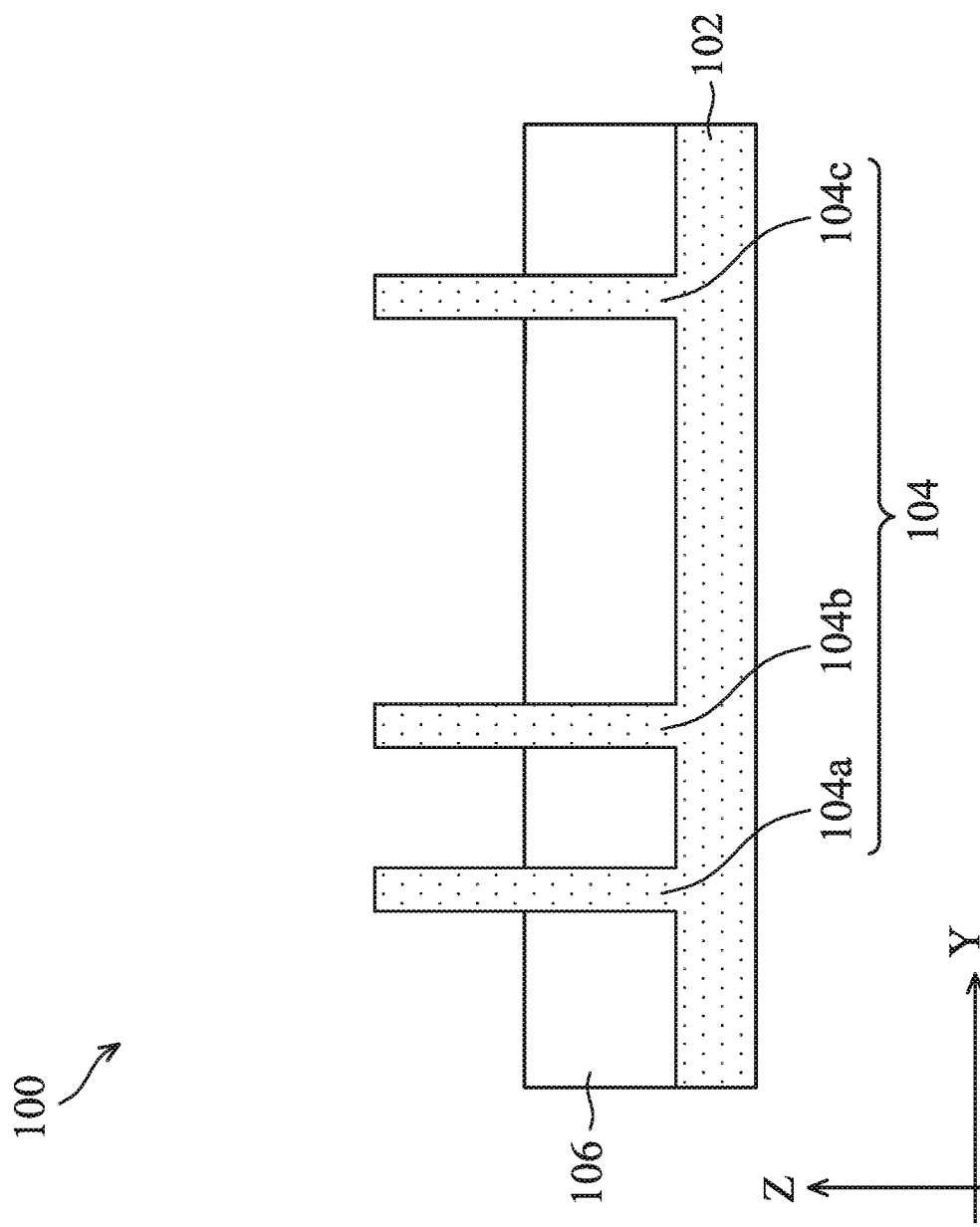

At operation 204b, the method 200 (FIG. 2B) removes the temporary gate structures 149 to form gate trenches 169, such as shown in FIGS. 7A and 7B, which are cross-sectional views of the device 100 along the A-A and E-E lines of FIG. 1A, respectively. The gate trenches 169 expose surfaces of the fins 104 and sidewall surfaces of the gate spacers 160. The operation 204b may include one or more etching processes that are selective to the material in the electrode layer 152 and the interfacial layer 150. The etching processes may include dry etching, wet etching, reactive ion etching, or other suitable etching methods.

Figure 8A:
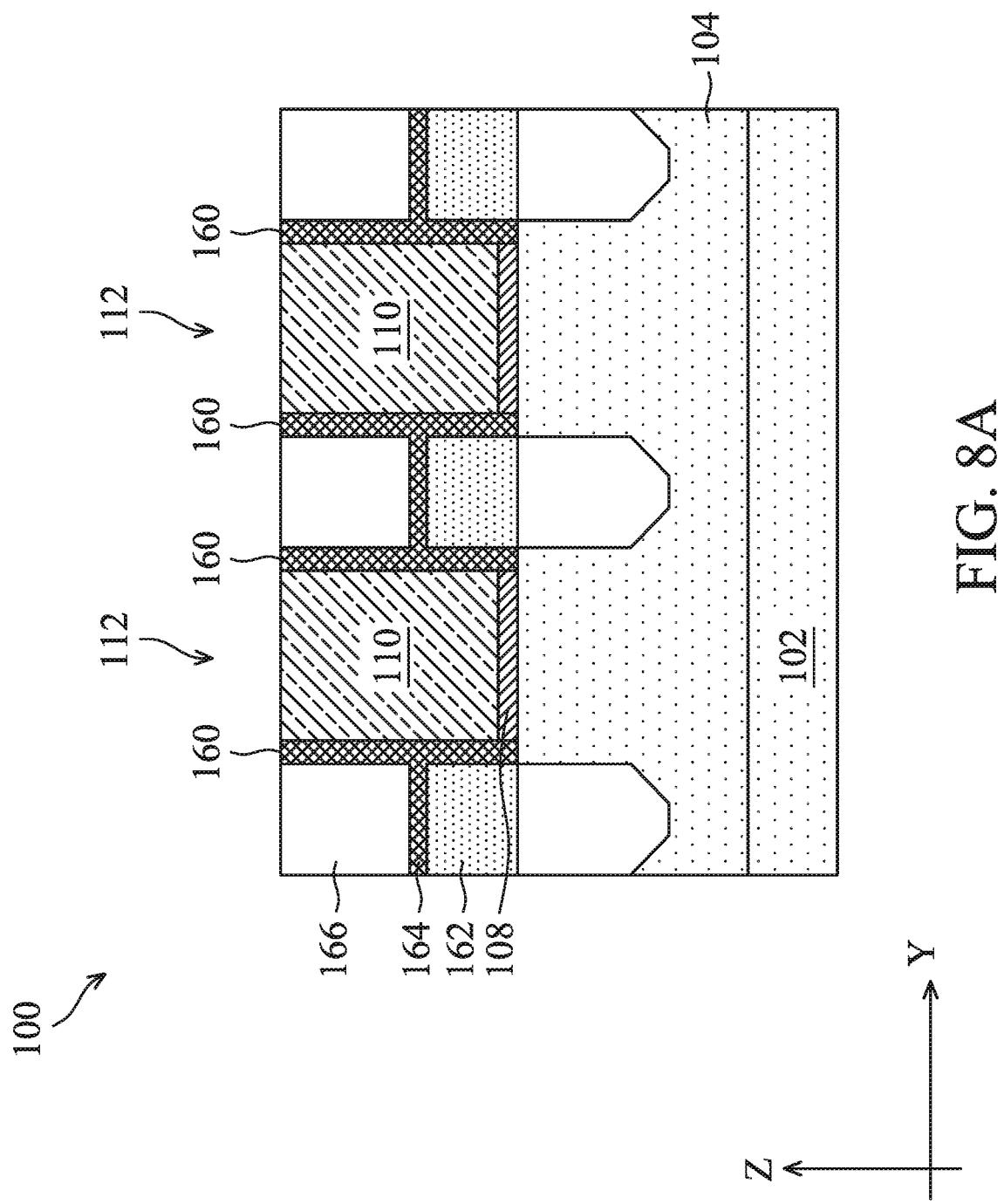
Figure 8B:
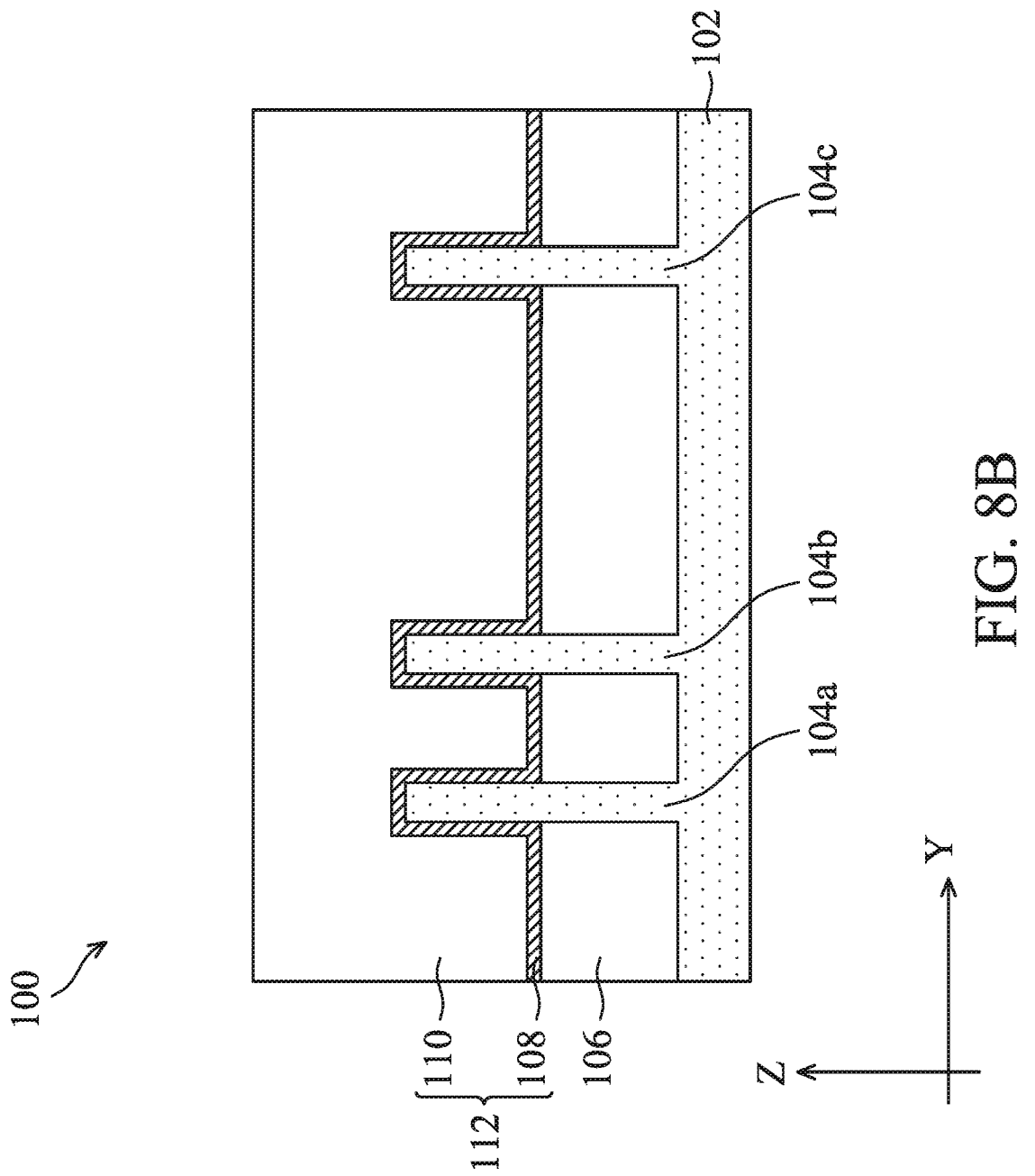

At operation 204c, the method 200 (FIG. 2B) deposits gate structures (e.g., high-k metal gates) 112 in the gate trenches 169, such as shown in FIGS. 8A and 8B which are cross-sectional views of the device 100 along the A-A and E-E lines of FIG. 1A, respectively. The gate structures 112 include the high-k dielectric layer 108 and the conductive layer 110. The gate structures 112 may further include an interfacial layer (e.g., $SiO_2$) (not shown) between the high-k dielectric layer 108 and the fins 104. The interfacial layer may be formed using chemical oxidation, thermal oxidation, ALD, CVD, and/or other suitable methods. The materials of the high-k dielectric layer 108 and the conductive layer 110 have been discussed above with reference to FIGS. 1A-1D. The high-k dielectric layer 108 may include one or more layers of high-k dielectric material, and may be deposited using CVD, ALD, and/or other suitable methods. The conductive layer 110 may include one or more work function metal layers and a metal fill layer, and may be deposited using methods such as CVD, PVD, plating, and/or other suitable processes.

Figure 9A:
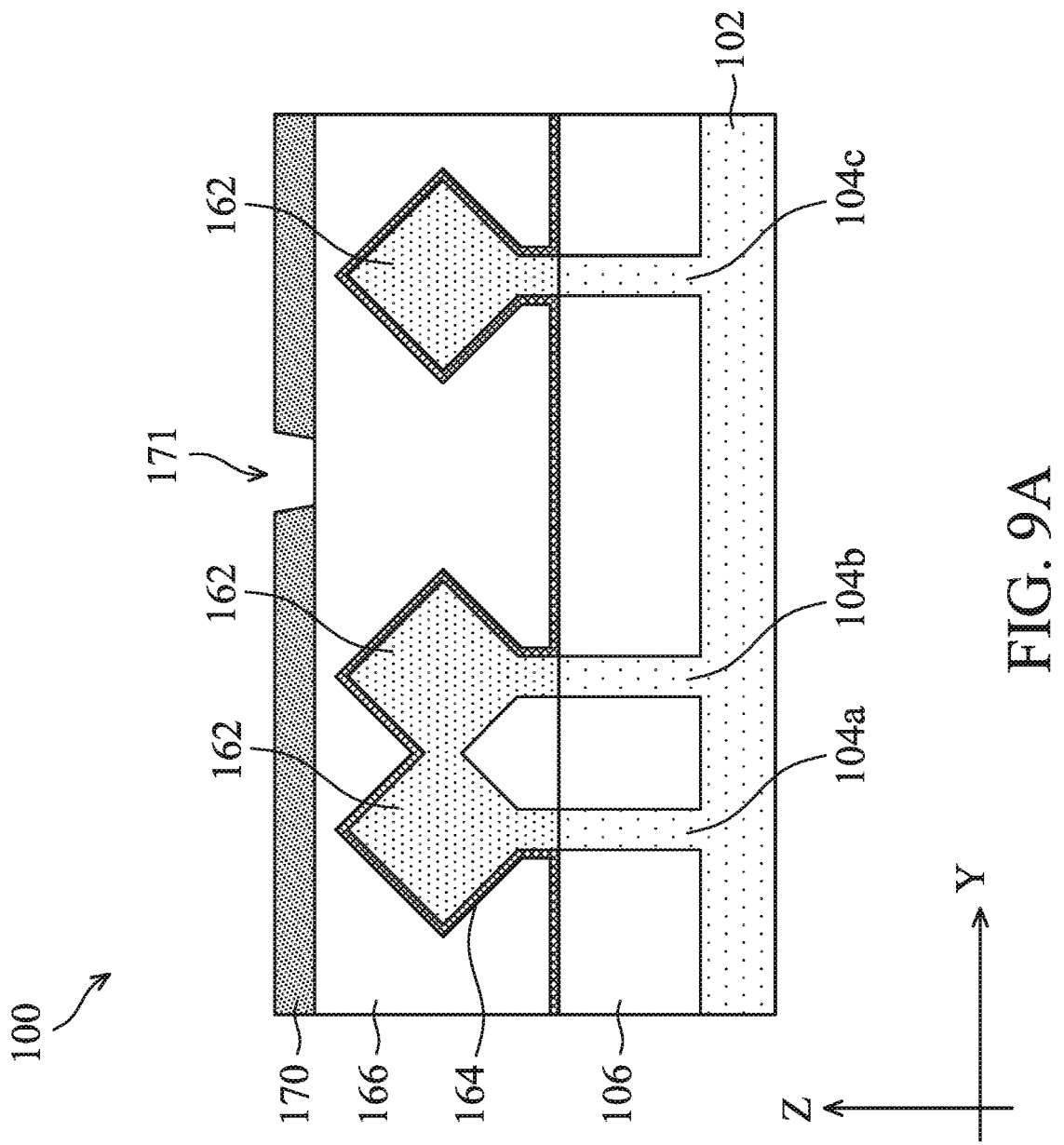
Figure 9B:
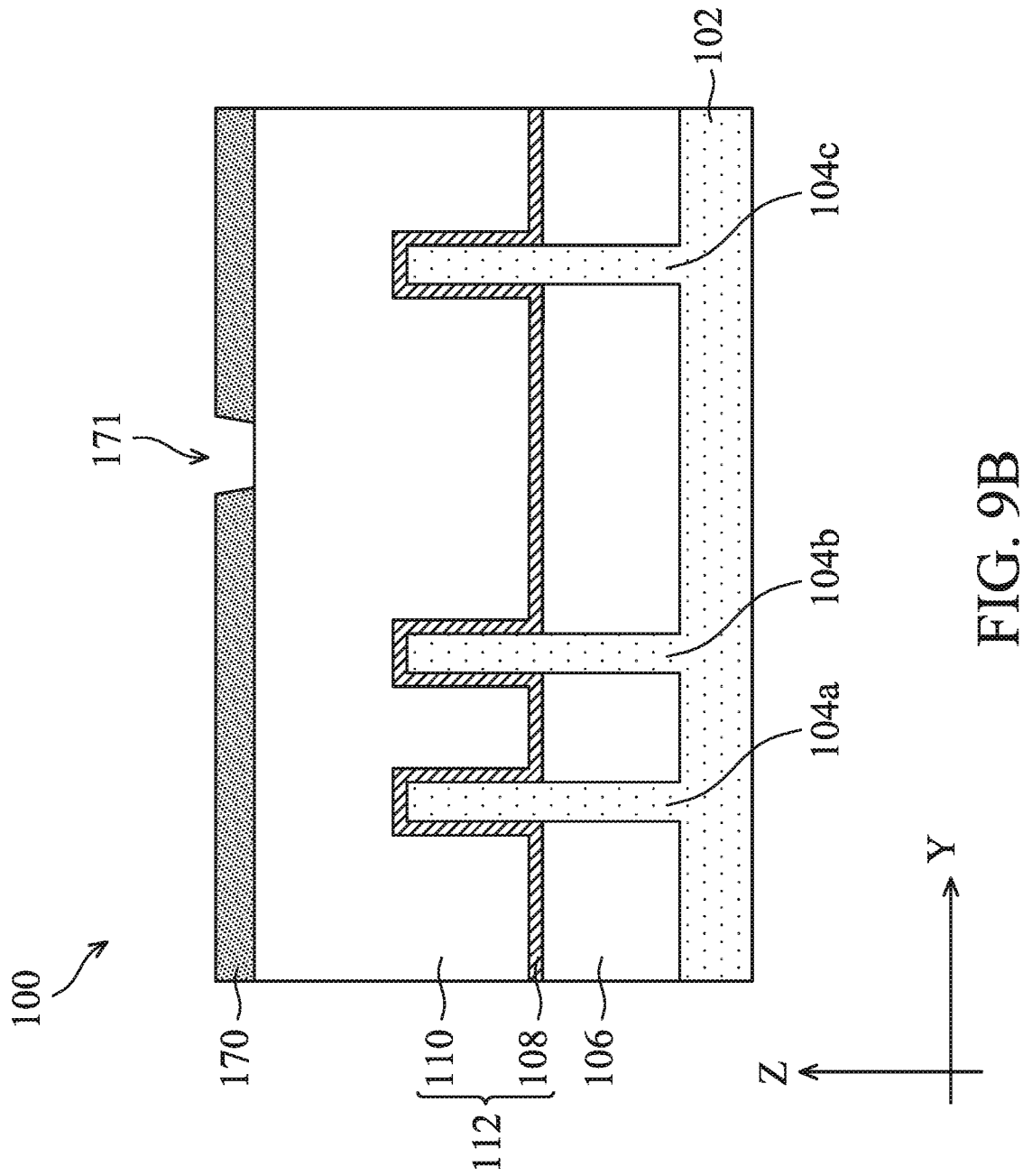

At operation 210, the method 200 (FIGS. 2A and 2B) forms one or more patterned hard mask layers over the device 100, such as shown in FIGS. 9A and 9B which are cross-sectional views of the device 100 along the D-D line and the E-E line of FIG. 1A, respectively. One hard mask layer 170 is illustrated in this example. The hard mask layer 170 may include titanium nitride, silicon nitride, amorphous silicon, yttrium silicate ($YSiO_x$), or other suitable hard mask material(s). In an embodiment, the operation 210 deposits the hard mask layer 170 using CVD, PVD, ALD, or other suitable methods, and subsequently patterns the hard mask layer 170 to form openings 171. The openings 171 correspond to positions of dielectric features 114 of FIG. 1A. The openings 171 expose the conductive layer 110 and the ILD layer 166. In an example, the operation 210 may form a patterned photoresist over the hard mask layer 170 by photoresist coating, exposing, post-exposure baking, and developing. In a particular embodiment, the operation 210 uses a single exposure process (e.g., using EUV exposure) to expose the photoresist layer to have a latent image, and then develops the photoresist layer to provide the openings. Then, the operation 210 etches the hard mask layer 170 using the patterned photoresist as an etch mask to form the opening 171. The etching process may include wet etching, dry etching, reactive ion etching, or other suitable etching methods. The patterned photoresist is removed thereafter, for example, by resist stripping.

Figure 10A:
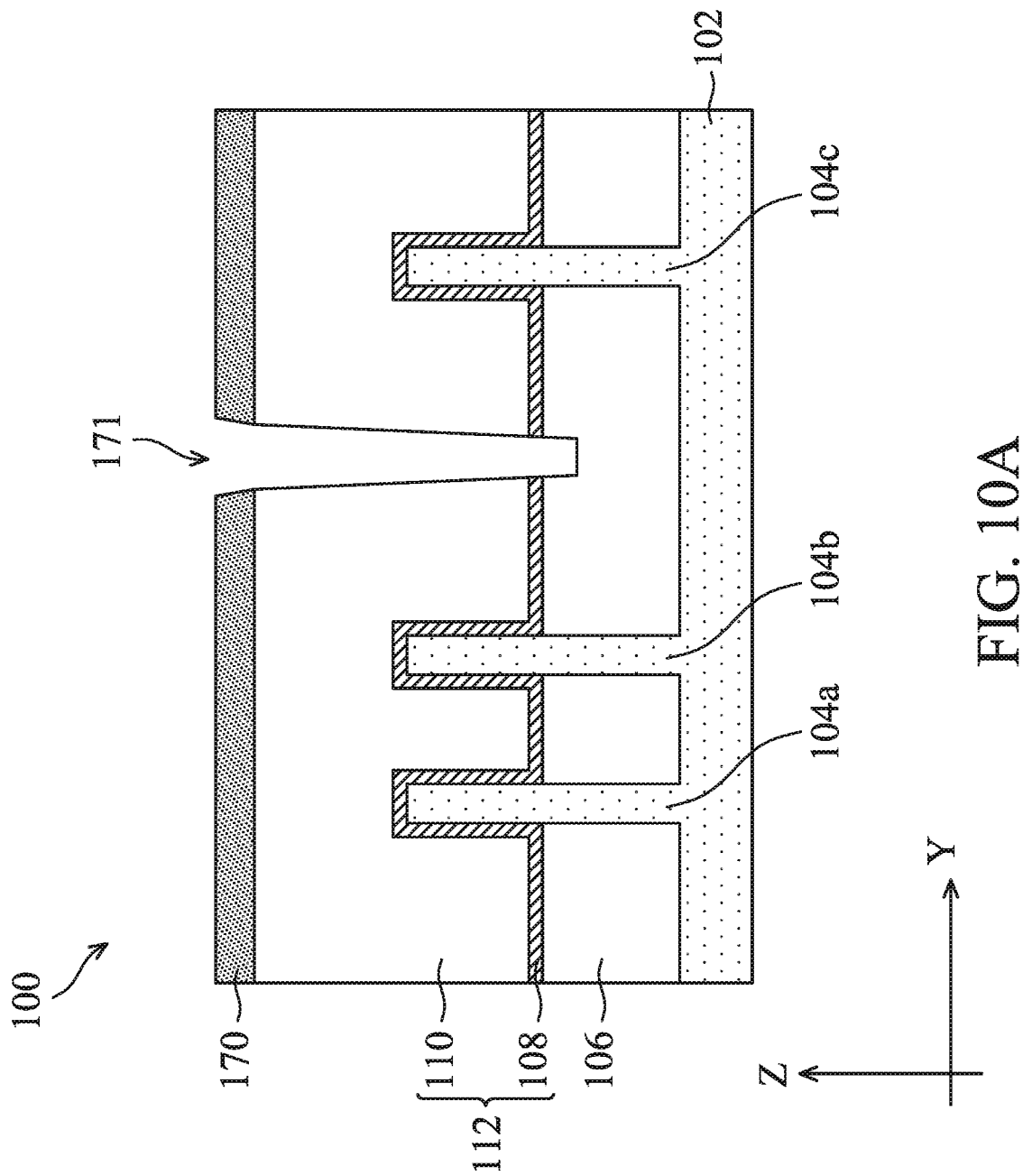

At operation 212, the method 200 (FIG. 2A) etches the gate structures 112 through the openings 171. Referring to FIG. 10A which is a cross-sectional view of the device 100 along the E-E line of FIG. 1A, the operation 212 extends the opening 171 down and through the gate structures 112, and also into the isolation structure 106 in an embodiment. The etching process may use one or more etchants or a mixture of etchants that etch the various layers in the gate structures 112. In an exemplary embodiment, the conductive layer 110 includes TiSiN, TaN, TiN, W, or a combination thereof. To etch such a conductive layer and the high-k dielectric layer 108, the operation 218 may apply a dry etching process with an etchant having the atoms of chlorine, fluorine, bromine, oxygen, hydrogen, carbon, or a combination thereof. For example, the etchant may have a gas mixture of $Cl_2$, $O_2$, a carbon-and-fluorine containing gas, a bromine-and-fluorine containing gas, and a carbon-hydrogen-and-fluorine containing gas. In one example, the etchant includes a gas mixture of $Cl_2$, $O_2$, $CF_4$, $BCl_3$, and $CHF_3$. To ensure the isolation between the remaining portions of the gate structure 112, the operation 212 performs some over-etching to extend the openings 171 into the isolation structure 106 in some embodiments. Such over-etching is carefully controlled to not expose the substrate 102. The extended openings 171 is also referred to as the CMG trench 171.

Figure 10B:
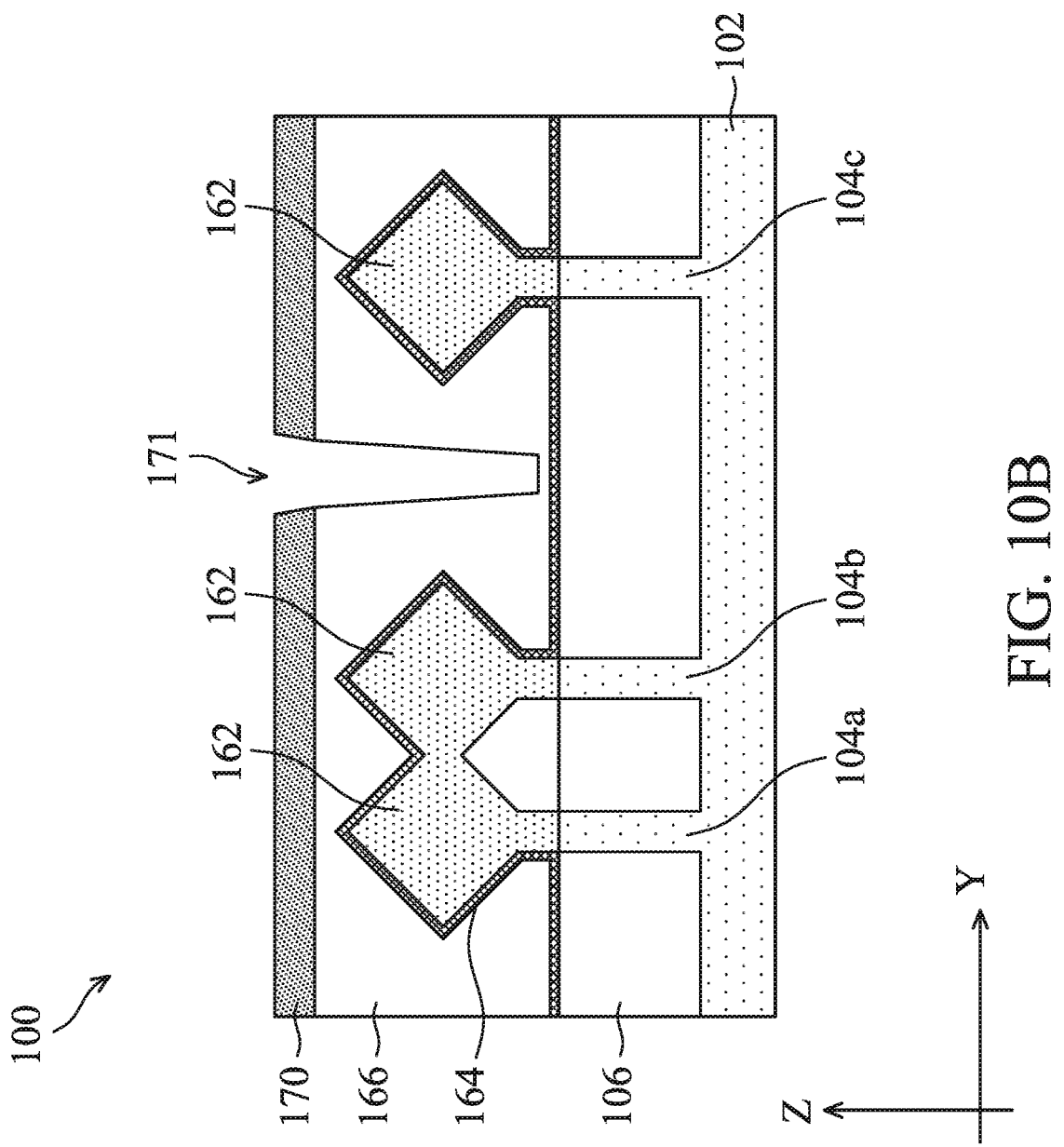

Referring to FIG. 10B which is a cross-sectional view of the device 100 along the D-D line of FIG. 1A, the etching process in operation 212 is also tuned to etch the ILD layer 166. Etchants selected to etch the gate structure 112 as well as the ILD layer 166 during the formation of the CMG trench 171 may have inequivalent etching rates among these material, such that different etching rates at different locations of the CMG trench 171 may result in different etching depth. In other words, a bottom surface of the CMG trench 171 may have a step profile, such that the bottom surface of the CMG trench 171 outside of the gate structure 112 is above the isolation structure 106 and extends into the isolation structure 106 at locations of the gate structure 112.

Figure 11A:
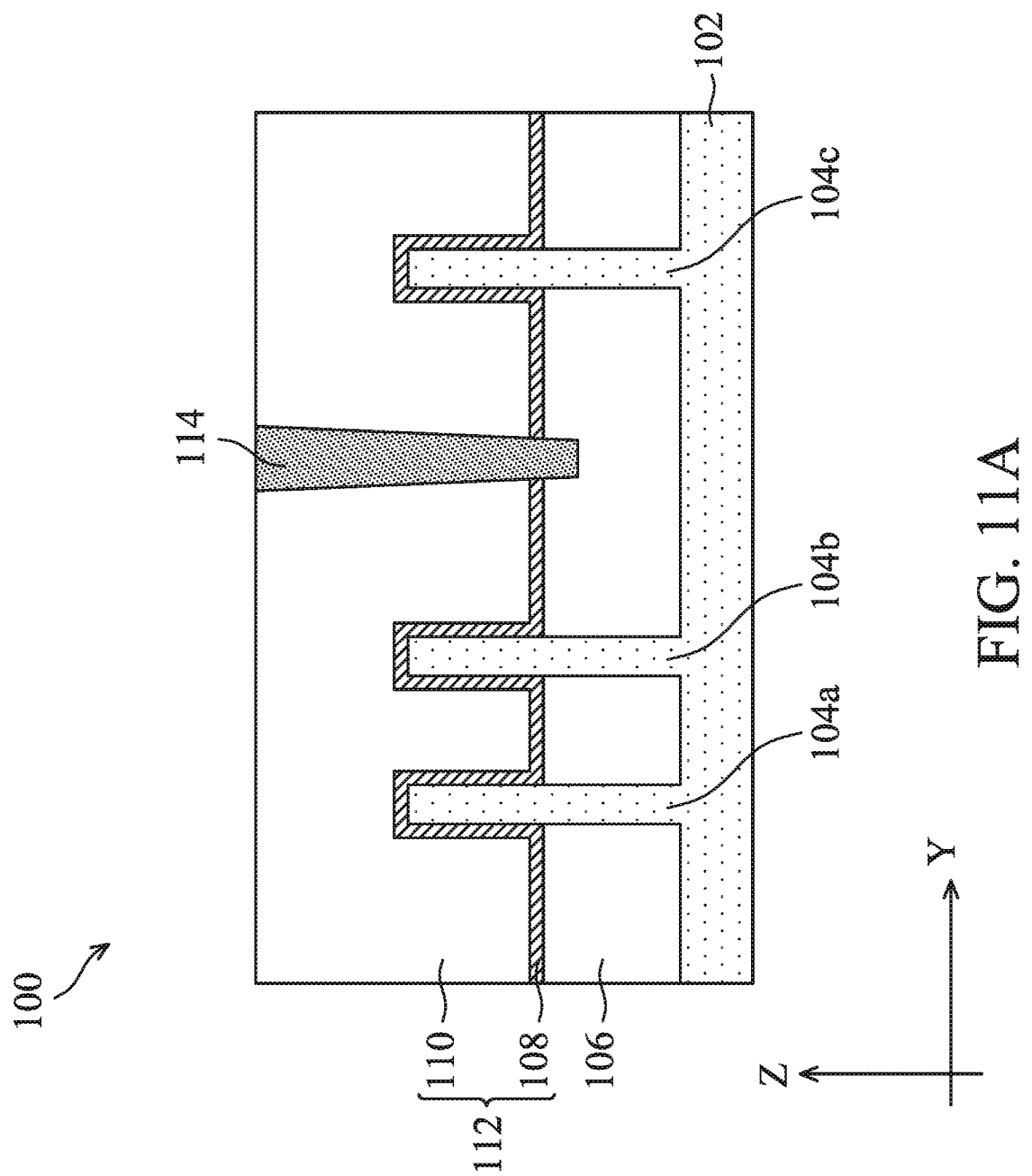
Figure 11B:
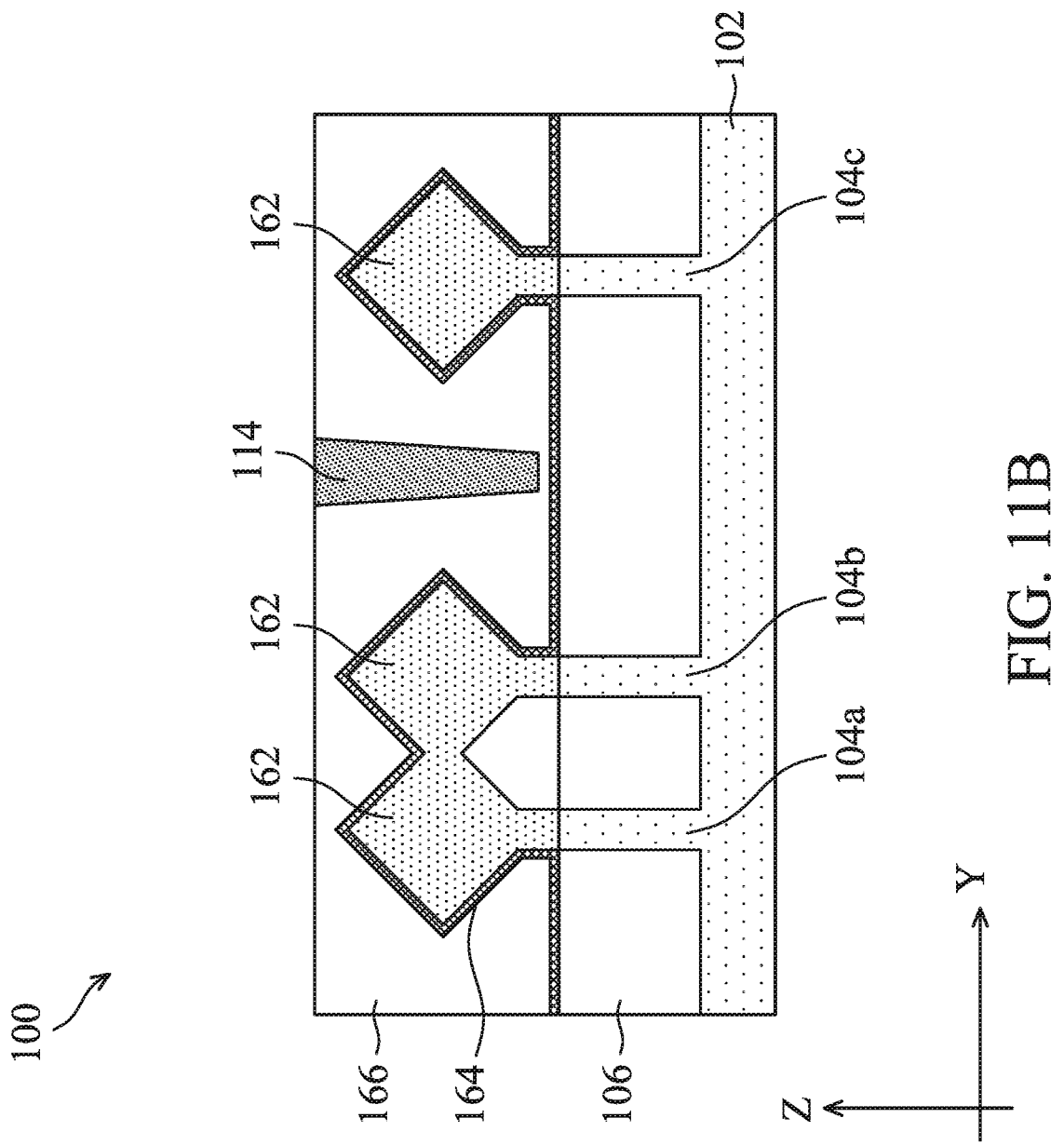

At operation 214, the method 200 (FIG. 2A) fills the CMG trenches 171 with one or more dielectric materials to form the dielectric features 114, and performs a chemical mechanical polishing (CMP) process to remove the patterned hard mask 170 and to planarize the top surface of the device 100. The resultant structure is shown in FIGS. 11A and 11B which are cross-sectional views of the device 100 along the E-E line and the D-D line of FIG. 1A, respectively. The one or more dielectric materials in the CMG trench 171 form the dielectric feature 114 (particularly, the dielectric feature 114a). Since the sidewalls of the gate structures 112 contain metallic materials, at least the outer portion of the dielectric feature 114 (that is in direct contact with the sidewalls of the gate structures 112) is free of active chemical components such as oxygen. For example, the outer portion of the dielectric feature 114 may include silicon nitride and is free of oxygen or oxide. The dielectric feature 114 may include some oxide in the inner portion thereof in some embodiments. Alternatively, the dielectric feature 114 may include one uniform layer of silicon nitride and is free of oxide. The dielectric feature 114 may be deposited using CVD, PVD, ALD, or other suitable methods. In the present embodiment, the dielectric feature 114 is deposited using ALD to ensure that it completely fills the CMG trenches 171.

Figure 12:
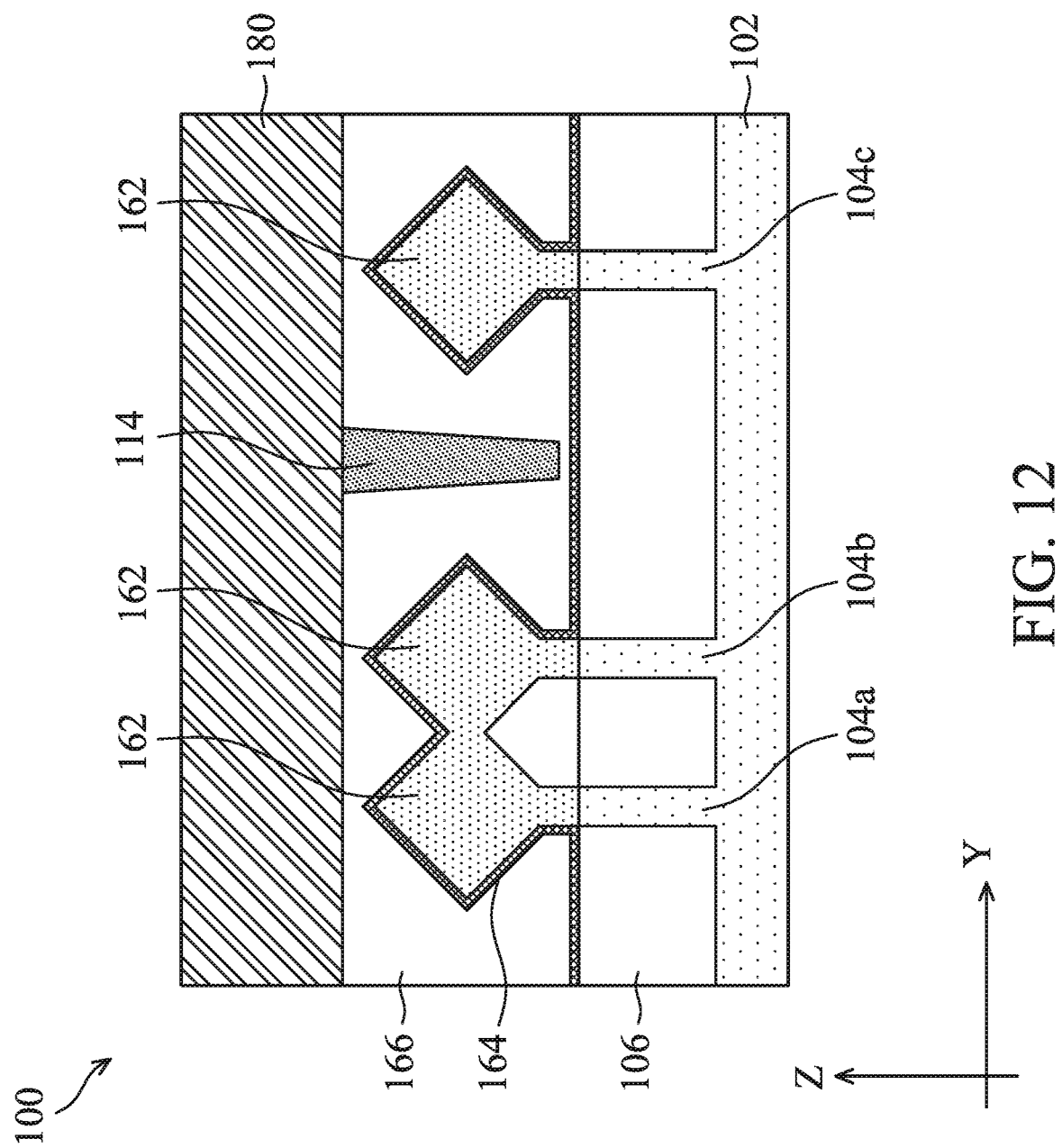

At operation 216, the method 200 (FIG. 2A) deposits a dielectric layer 180 over the device 100, such as shown in FIG. 12, which is a cross-sectional view of the device along the D-D line of FIG. 1A. In an embodiment, the dielectric layer 180 is another ILD layer and may comprise TEOS oxide, un-doped silicate glass, or doped silicon oxide such as BPSG, FSG, PSG, BSG, and/or other suitable dielectric materials. The dielectric layer 180 may be formed by PECVD, FCVD, or other suitable methods.

Figure 13:
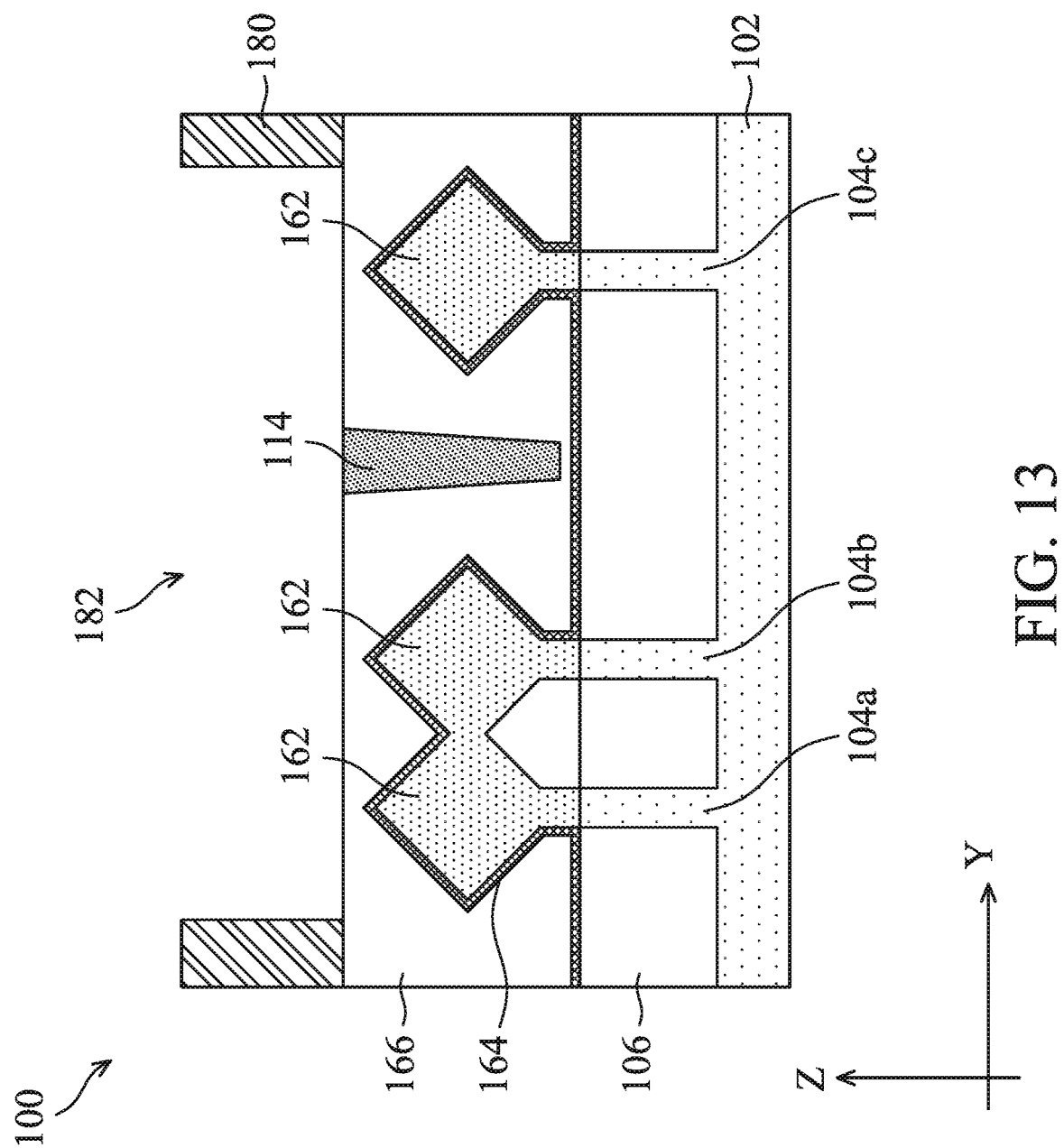

At operation 218, the method 200 (FIG. 2C) etches contact holes 182 into the device 100, exposing the dielectric feature 114, such as shown in FIG. 13, which is a cross-sectional view of the device along the D-D line of FIG. 1A. In an embodiment, the operation 218 includes coating a photoresist layer over the device 100, exposing and developing the photoresist layer to form openings, and etching the second ILD layer 180 to form the contact holes 182. A capping layer (not shown) may be disposed between the first ILD layer 166 and the second ILD layer 180. Particularly, the capping layer may function as an etch stop layer, such that the etching process is tuned to selectively etch the second ILD layers 180 but not the capping layer. Then a subsequent etching process is tuned to open the capping layer to expose the first ILD layer 166 and the dielectric feature 114a. The etching process is dry etching in an embodiment. For example, the etchant may have a gas mixture of $CF_4$, $H_2$, and $N_2$.

Figure 14:
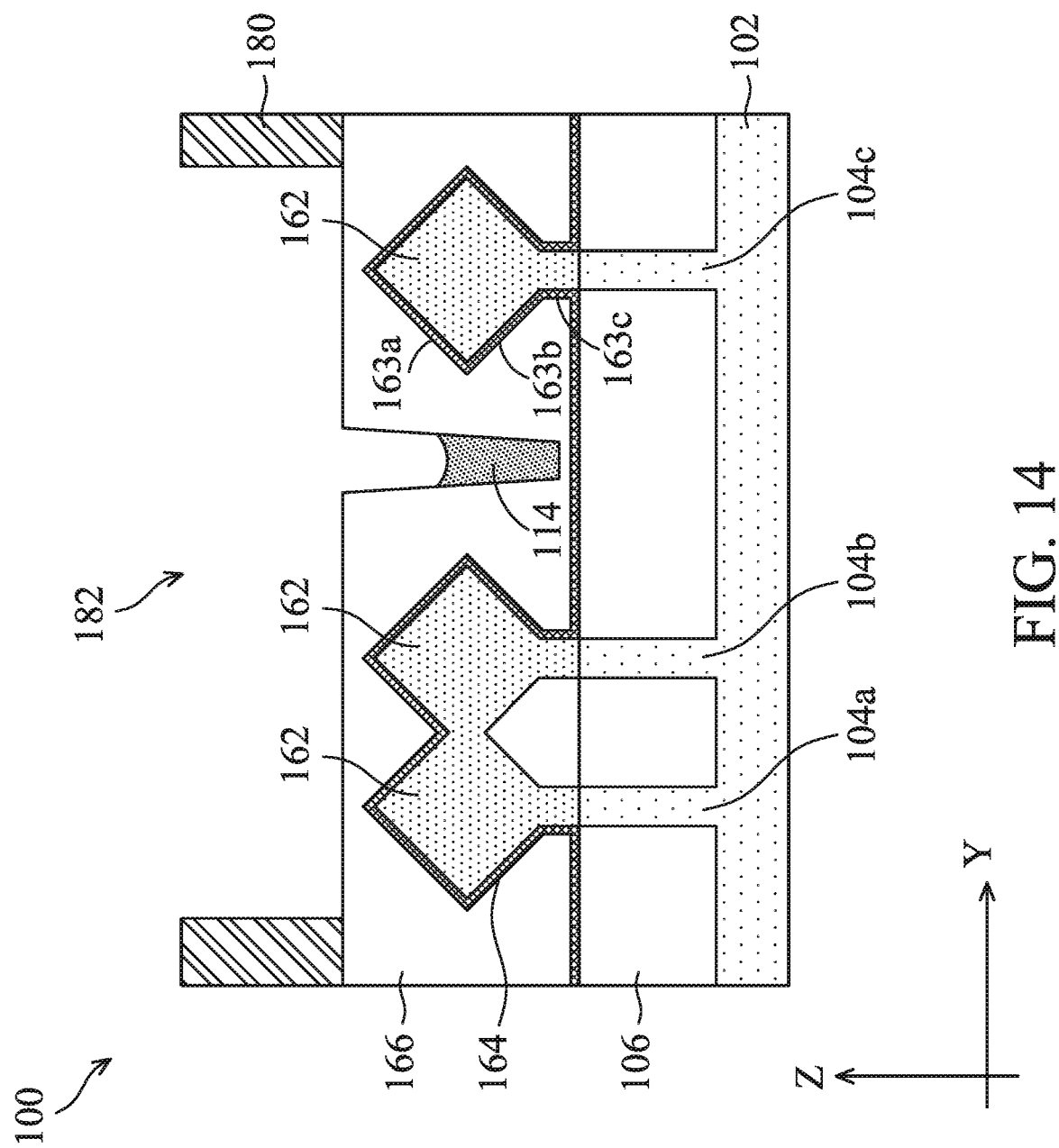

At operation 220, the method 200 (FIG. 2C) selectively recesses the dielectric feature 114 without substantially etching the first ILD layer 166, such as shown in FIG. 14, which is a cross-sectional view of the device along the D-D line of FIG. 1A. The recess etching process is a selective etching process that provides etchants that may selectively etch the dielectric feature 114 without damaging or attacking the first ILD layer 166. Thus, the first ILD layer 166 remains intact. By doing so, the dielectric feature 114 and the first ILD layer 166 may be separately and individually etched at different processing stages. The selective recess etching process is dry etching in an embodiment. For example, the etchant may have a gas mixture of $CH_3F$ and $H_2$. After operation 202, the dielectric feature 114 may be recessed for at least 50 nm in Z direction in some embodiments and a concave top surface of the dielectric feature 114 may be formed. Operation 202 may recess the dielectric feature 114 all the way below the upward-facing sidewall 163a of an adjacent S/D feature 162. Alternatively, a top portion of the dielectric feature 114 may still remain higher than a bottom portion of the upward-facing sidewall 163a, while a subsequent etching of the first ILD layer 166 will further recess the dielectric feature 114 as well.

Figure 15:
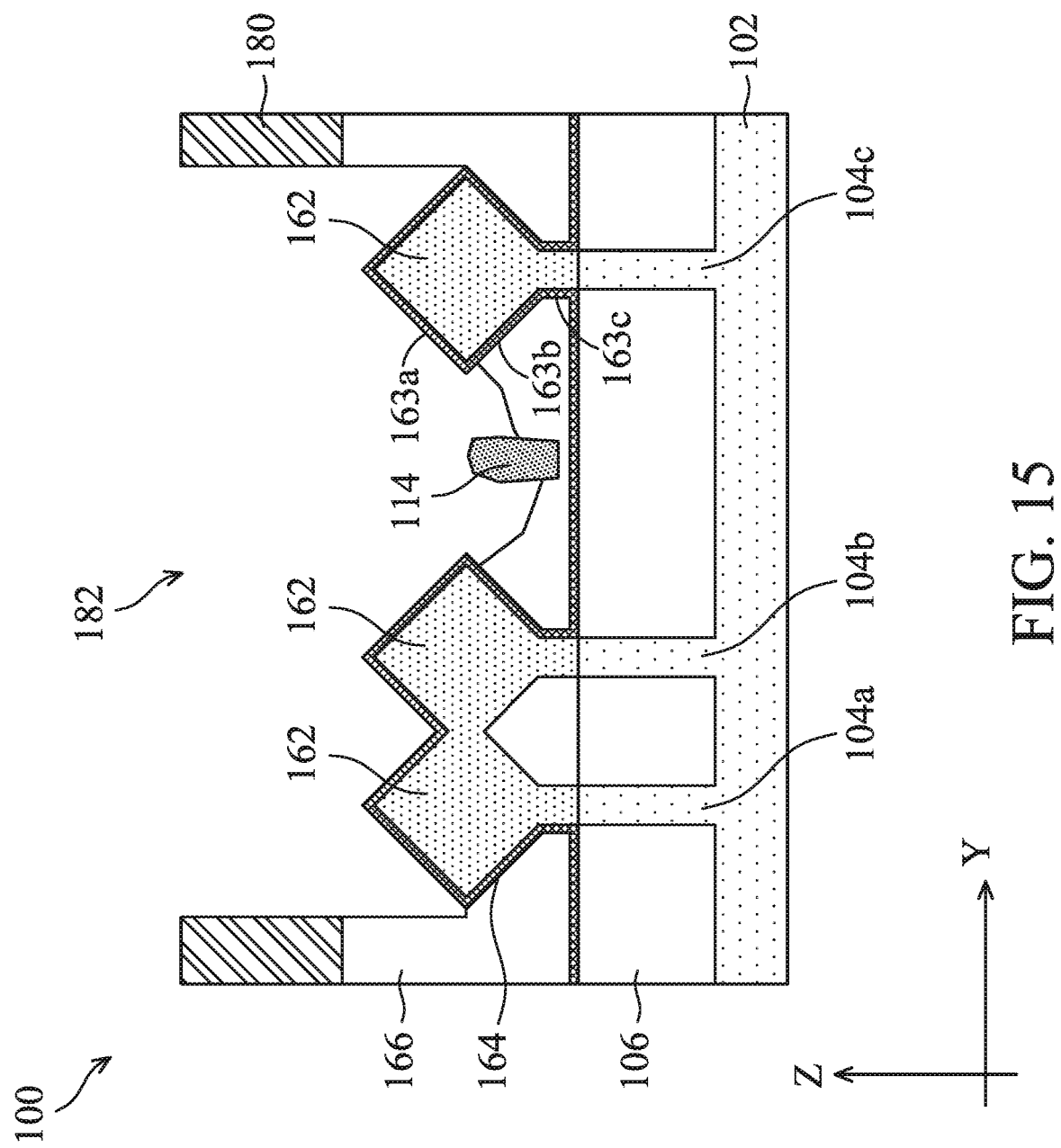

At operation 222, the method 200 (FIG. 2C) selectively etches the first ILD layer 166 to extend the contact hole 182 downwardly to expose at least upward-facing sidewalls 163a of the S/D features 162, such as shown in FIG. 15, which is a cross-sectional view of the device along the D-D line of FIG. 1A. In some embodiments, the recess etching process is a selective etching process that provides etchants that selectively etches the first ILD layer 166 without substantially etching the dielectric feature 114. In some embodiments, the recess etching process is a selective etching process that is also tuned to etch the dielectric feature 114, but in a slower etching rate. For example, an etching rate ratio of the first ILD layer 166 over the dielectric feature 114 may be larger than about 5:1. After recessing the first ILD layer 166, the dielectric feature 114 may protrude from the surrounding first ILD layer 166. Since operation 222 may also etch a portion of the dielectric feature 114, the dielectric feature 114 may further be recessed to be below the upward-facing sidewall 163a of an adjacent S/D feature 162. The selective recess etching process is dry etching in an embodiment. For example, the etchant may have a gas mixture of $C_4F_6$, CO, $CO_2$, and Ar. The top surface of the dielectric feature 114 may become convex during the etching process.

Figure 16:
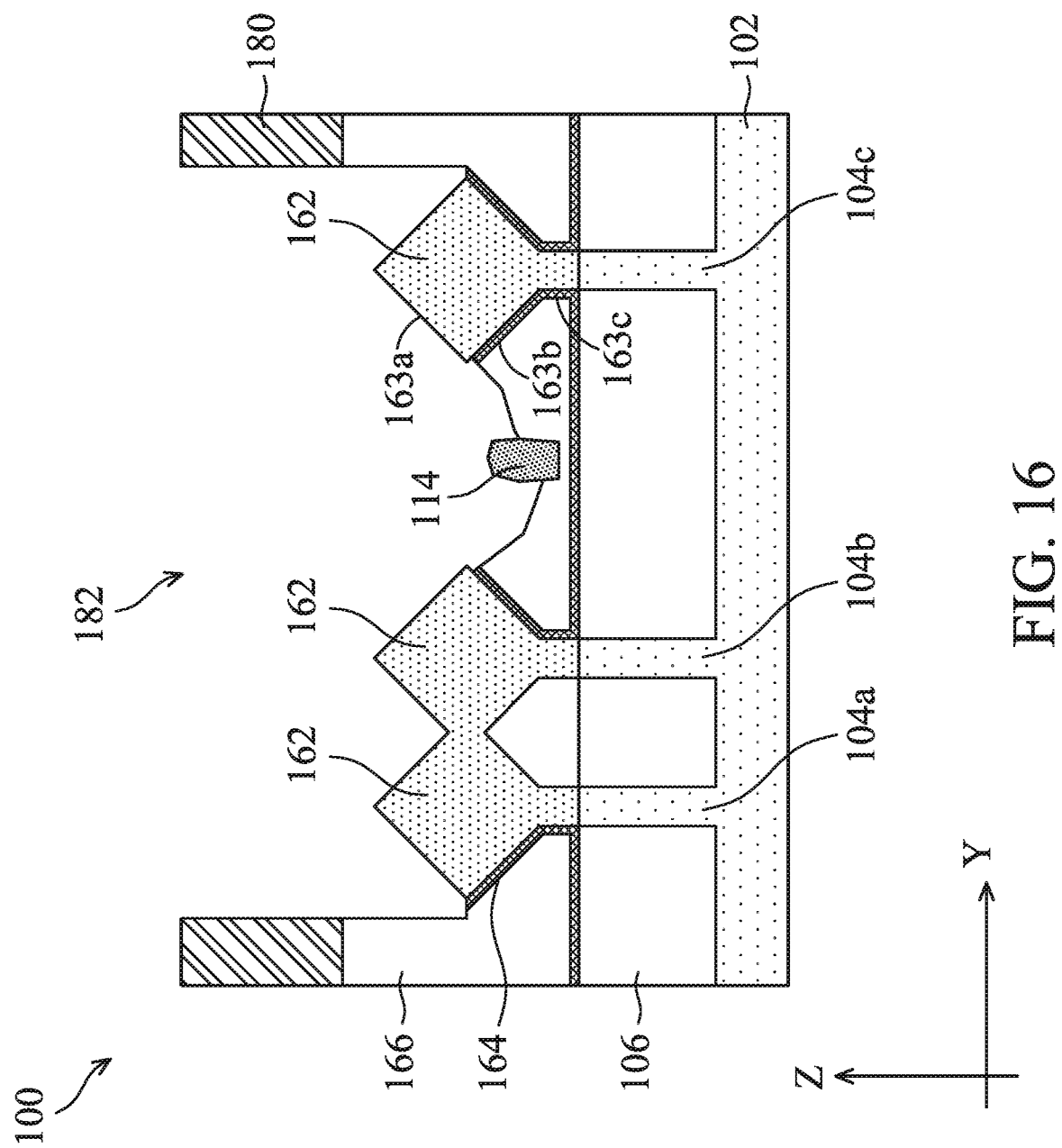

At operation 224, the method 200 (FIG. 2C) removes exposed CESL 164 from the contact hole 182, such as shown in FIG. 16, which is a cross-sectional view of the device along the D-D line of FIG. 1A. The recess etching process is a selective etching process that provides etchants that may selectively etch the CESL 164 without substantially etch the first ILD layer 166. In some embodiments, the CESL 164 and the dielectric feature 114 both contain nitride, therefore an etching selectivity towards the dielectric feature 114 is poor, which further recesses the dielectric feature 114 for about 2 nm to about 5 nm. In some embodiments, after operation 224, the dielectric feature 114 is below a downward-facing sidewall 163b of an adjacent S/D feature 162.

Figure 17:
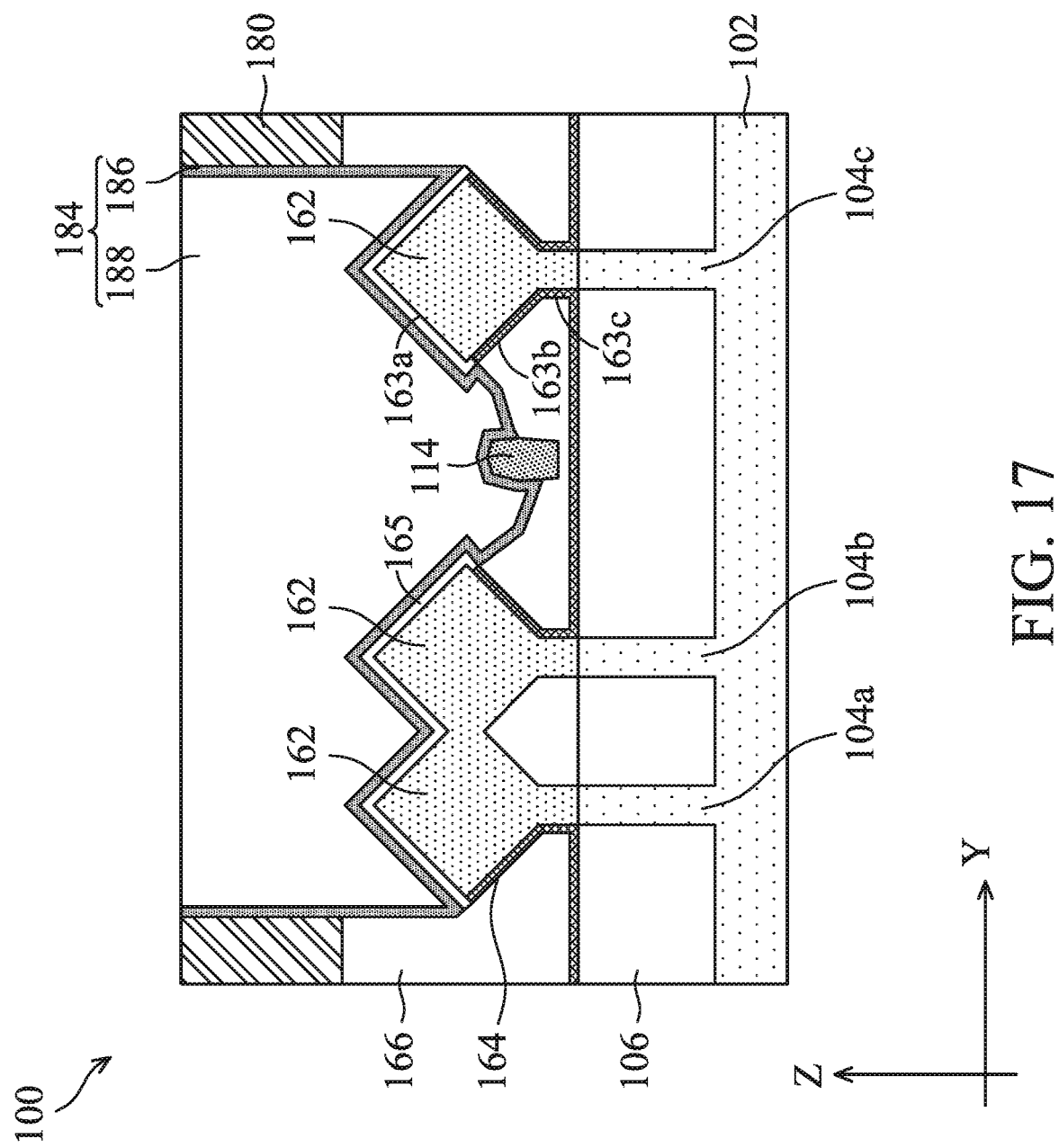
Figure 18:
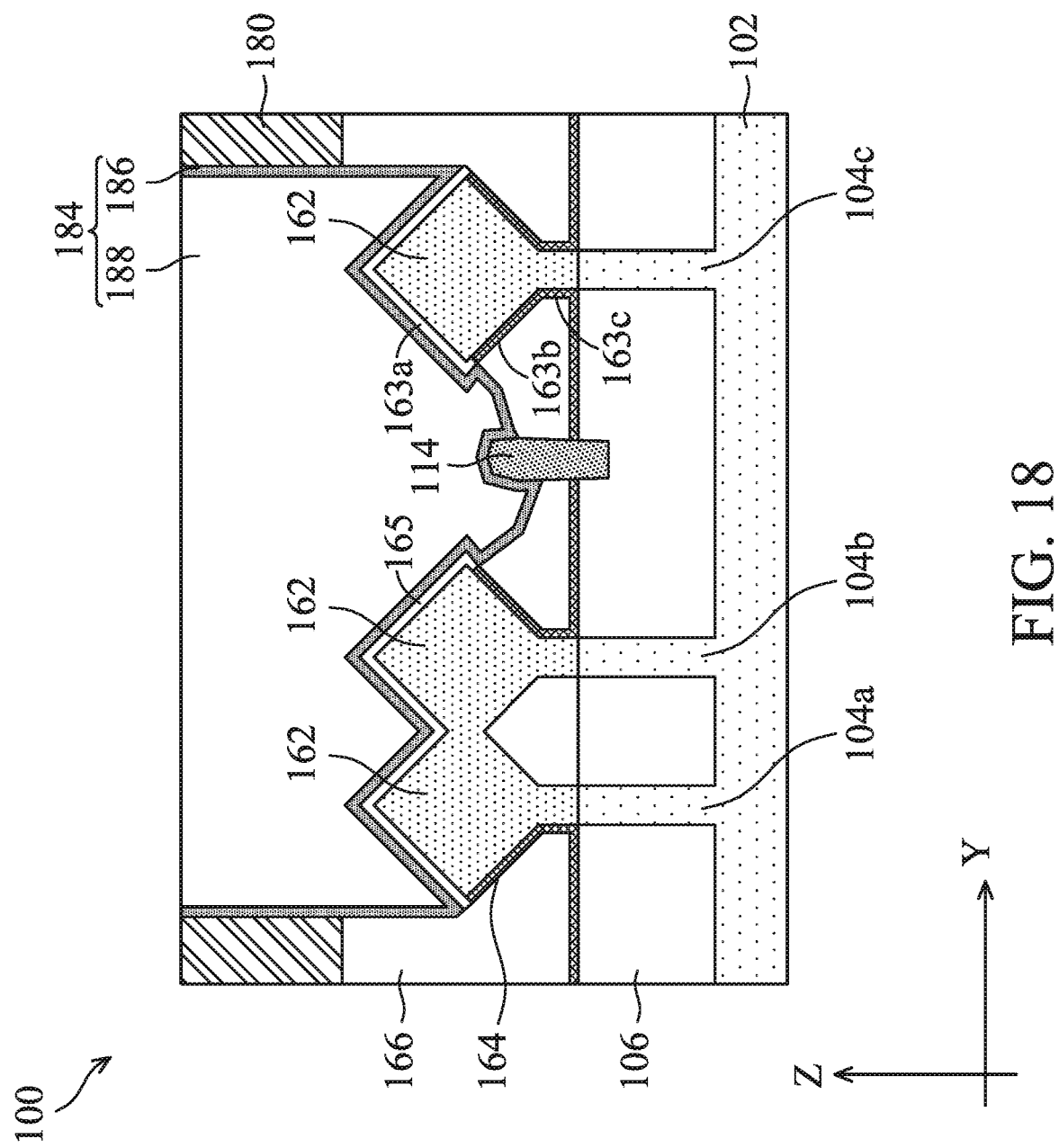

At operation 226, the method 200 (FIG. 2C) deposits one or more conductive materials 184 into the contact holes 182 as S/D contacts, such as shown in FIG. 17, which is a cross-sectional view of the device along the D-D line of FIG. 1A. In an embodiment, the method 200 may form silicide features 165 over the exposed surfaces of the S/D features 162 before depositing the conductive materials 184. In some embodiments, the silicide features 165 is formed by silicidation such as self-aligned silicide in which a metal material is formed over the S/D features 162, then the temperature is raised to anneal and cause reaction between underlying silicon and the metal to form silicide, and unreacted metal is etched away. The silicide features 165 helps reduce contact resistance. In an embodiment, the conductive materials 184 includes a barrier layer 186 such as TaN or TiN and a metal fill layer 188 such as Al, Cu, or W. The layers in the conductive materials 184 may be deposited using CVD, PVD, PECVD, ALD, plating, or other suitable methods. Due to the large surface area of the S/D features 162, the S/D contact has a sufficiently large interface with the underlying S/D feature 162 for reducing S/D contact resistance. In FIG. 17, the bottom surface of the dielectric feature 114 is above the top surface of the isolation structure 106 outside of the gate region, such that the bottom surface of the dielectric feature 114 along the X direction from outside of the gate region into the gate region may have a step profile, for example, with a step height ranging from about 2 nm to about 10 nm. Yet in some alternative embodiments, as discussed above, the bottom portion of the dielectric feature 114 may also extend into the isolation feature 106, as shown in FIG. 18. Accordingly, the bottom surface of the dielectric feature 114 along the X direction from outside of the gate region into the gate region may be substantially flat or with a smaller step height, such as ranging from about 1 nm to about 5 nm.

At operation 228, the method 200 (FIG. 2C) performs further steps to complete the fabrication of the device 100. For example, the method 200 may performs a CMP process to remove excessive materials 184 and form metal interconnects electrically connecting the source, drain, gate terminals of various transistors to form a complete IC.

Although not intended to be limiting, one or more embodiments of the present disclosure provide many benefits to a semiconductor device and the formation thereof. For example, embodiments of the present disclosure provide a cut metal gate process followed by a selective etching process to recess the isolation material in S/D contact holes. This allows larger landing area for S/D contacts. This not only increases device integration, but also reduces S/D contact resistance.

In one exemplary aspect, the present disclosure is directed to a method. The method includes providing a structure having a substrate, a fin over the substrate and oriented lengthwise generally along a first direction, a source/drain (S/D) feature over the fin, a first dielectric layer covering a top surface and sidewalls of the S/D feature, an isolation feature embedded in the first dielectric layer, wherein a top surface of the isolation feature is above the S/D feature, and a second dielectric layer covering the first dielectric layer and the isolation feature; performing a first etching process to recess the second dielectric layer to expose the isolation feature; performing a second etching process to selectively recess the isolation feature; and performing a third etching process to recess the first dielectric layer to expose the S/D feature. In some embodiments, the method further includes depositing a conductive material in direct contact with the S/D feature and the isolation feature. In some embodiments, the S/D feature has an upward-facing sidewall, wherein the second etching process selectively recesses the isolation feature, such that a portion of the top surface of the isolation feature is below the upward-facing sidewall. In some embodiments, the structure further has a gate structure over the fin and oriented lengthwise generally along a second direction perpendicular to the first direction, wherein the isolation feature extends along the first direction and divides the gate structure into two portions. In some embodiments, after the second etching process, a portion of the top surface of the isolation feature is coplanar with a top surface of the gate structure. In some embodiments, a bottom surface of the isolation feature has a step profile. In some embodiments, the performing of the second etching process is prior to the performing of the third etching process. In some embodiments, the third etching process is tuned to also etch the isolation feature. In some embodiments, after the third etching process, levels of the first dielectric layer disposed on opposing sidewalls of the isolation feature are uneven. In some embodiments, after the second etching process, the top surface of the isolation feature becomes concave, and wherein after the third etching process, the top surface of the isolation feature becomes convex.

In another exemplary aspect, the present disclosure is directed to a method for manufacturing a semiconductor device. The method includes forming first and second fins on a substrate, the first and second fins have a gate region and a source/drain (S/D) region; forming a gate structure over the first and second fins in the gate region; depositing a dielectric layer between the first and second fins, the dielectric layer covering sidewalls of the gate structure; performing an etching process to form a trench that divides the gate structure, the trench extending into an area of the dielectric layer between the first and second fins; filling the trench with a dielectric material; selectively etching the dielectric material; selectively etching the dielectric layer; and depositing a conductive material atop the first and second fins in the S/D region and in direct contact with the dielectric material. In some embodiments, the dielectric material and the dielectric layer have different material compositions, such that the selectively etching of the dielectric material substantially does not etch the dielectric layer. In some embodiments, after the selectively etching of the dielectric layer, the dielectric material protrudes from the dielectric layer. In some embodiments, the selectively etching of the dielectric material is prior to the selectively etching of the dielectric layer. In some embodiments, the method further includes forming S/D features atop the first and second fins, the S/D features having upward-facing sidewalls, where a top surface of the dielectric material is recessed from a position above the upward-facing sidewalls to below the upward-facing sidewalls, before and after the selectively etching of the dielectric material. In some embodiments, the filling of the trench with the dielectric material includes performing an atomic layer deposition (ALD) process.

In yet another exemplary aspect, the present disclosure is directed to a semiconductor device. The semiconductor device includes a substrate; a fin protruding out of the substrate; an epitaxial source/drain (S/D) feature over the fin; a dielectric feature adjacent to the epitaxial S/D feature, wherein the dielectric feature is below an upward-facing sidewall of the epitaxial S/D feature; and a conductive feature in direct contact with the epitaxial S/D feature and the dielectric feature. In some embodiments, the semiconductor device further includes a dielectric layer surrounding the epitaxial S/D feature and the dielectric feature, wherein levels of the dielectric layer disposed on opposing sidewalls of the dielectric feature are uneven. In some embodiments, the semiconductor device further includes a metal gate structure over the fin in a channel region, wherein the dielectric feature divides the metal gate structure into at least a first portion and a second portion. In some embodiments, a bottom surface of the dielectric feature has a step profile.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
    forming a fin protruding from a substrate;
    forming a gate structure across the fin;

forming an epitaxial feature over the fin;
depositing a dielectric layer covering the epitaxial feature and over sidewalls of the gate structure;
performing an etching process to form a trench, the trench dividing the gate structure into first and second gate segments and extending into a region of the dielectric layer;
forming a dielectric feature in the trench;
recessing a portion of the dielectric feature located in the region;
selectively etching the dielectric layer to expose the epitaxial feature; and
depositing a conductive feature in physical contact with the epitaxial feature and directly above the portion of the dielectric feature.

2. The method of claim 1, wherein during the recessing of the portion of the dielectric feature, another portion of the dielectric feature positioned laterally between the first and second gate segments remains substantially intact.

3. The method of claim 1, wherein the dielectric feature and the dielectric layer have different material compositions, such that during the recessing of the portion of the dielectric feature, the dielectric layer remains substantially intact.

4. The method of claim 1, wherein after the selectively etching of the dielectric layer, the dielectric feature protrudes from the dielectric layer.

5. The method of claim 1, wherein the recessing of the dielectric feature is prior to the selectively etching of the dielectric layer.

6. The method of claim 1, wherein the epitaxial feature includes an upward-facing facet, and after the selectively etching of the dielectric layer, the portion of the dielectric feature is recessed below the upward-facing facet.

7. The method of claim 6, wherein the portion of the dielectric feature is recessed below a bottom edge of the upward-facing facet.

8. The method of claim 1, wherein the conductive feature is in physical contact with the dielectric feature.

9. The method of claim 1, further comprising:
prior to the depositing of the dielectric layer, depositing an etch stop layer on the epitaxial feature,
wherein a bottom surface of the portion of the dielectric feature is above a portion of the etch stop layer.

10. The method of claim 1, further comprising:
prior to the depositing of the dielectric layer, depositing an etch stop layer on the epitaxial feature,
wherein the dielectric feature is in physical contact with the etch stop layer.

11. A method, comprising:
providing a structure having first and second fins over a substrate and oriented lengthwise generally along a first direction and source/drain (S/D) features over the first and second fins;
forming an interlayer dielectric (ILD) layer covering the S/D features;
performing a first etching process at least to a region laterally between the S/D features, thereby forming a trench in the ILD layer;
depositing a dielectric material in the trench;
performing a second etching process to selectively recess the dielectric material; and
performing a third etching process to selectively recess the ILD layer, thereby forming a contact hole that exposes the S/D features.

12. The method of claim 11, wherein the contact hole also exposes the dielectric material.

13. The method of claim 11, wherein after the performing of the third etching process, a top portion of the dielectric material protrudes from the recessed ILD layer.

14. The method of claim 11, further comprising:
forming an S/D contact in the contact hole, wherein the S/D contact is in physical contact with the S/D features and the dielectric material.

15. The method of claim 11, further comprising:
forming an isolation feature on the substrate and between the first and second fins,
wherein a bottom surface of the trench is above a top surface of the isolation feature.

16. The method of claim 11, further comprising:
forming an isolation feature on the substrate and between the first and second fins,
wherein a bottom surface of the trench is under a top surface of the isolation feature.

17. The method of claim 11, wherein the second etching process and the third etching process collectively recess the dielectric material from a first position above top surfaces of the S/D features to a second position below the top surfaces of the S/D features.

18. A method, comprising:
forming a fin over a substrate, the fin oriented lengthwise generally along a first direction;
forming first and second gate structures over the fin, the first and second gate structures oriented lengthwise generally along a second direction perpendicular to the first direction;
depositing a dielectric layer on sidewalls of the first and second gate structures and atop the fin;
forming a trench offset from the fin and across the first and second gate structures, the trench oriented lengthwise generally along the first direction;
forming a dielectric feature in the trench, the dielectric feature dividing each of the first and second gate structures into segments;
recessing a portion of the dielectric feature between the first and second gate structures, such that a top surface of the dielectric feature is below a top surface of the dielectric layer;
recessing a portion of the dielectric layer between the first and second gate structures to form an opening, such that the top surface of the dielectric feature is above a bottom surface of the opening; and
depositing a conductive feature in the opening.

19. The method of claim 18, wherein the conductive feature is in physical contact with the top surface of the dielectric feature.

20. The method of claim 18, further comprising:
epitaxially growing a semiconductor feature over the fin and between the first and second gate structures,
wherein the conductive feature electrically couples to the semiconductor feature, and the top surface of the dielectric feature is below the semiconductor feature.

* * * * *